(12) United States Patent
Park et al.

(10) Patent No.: US 9,171,617 B1
(45) Date of Patent: Oct. 27, 2015

(54) RESISTIVE MEMORY DEVICE AND METHOD PROGRAMMING SAME

(71) Applicant: SAMSUNG ELECTRONICS CO., LTD., Suwon-Si, Gyeonggi-Do (KR)

(72) Inventors: Hyun-Kook Park, Anyang-Si (KR); Yeong-Taek Lee, Seoul (KR); Dae-Seok Byeon, Seongnam-Si (KR); Yong-Kyu Lee, Hwaseong-Si (KR); Hyo-Jin Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/667,993

(22) Filed: Mar. 25, 2015

(30) Foreign Application Priority Data

Jun. 27, 2014 (KR) .................. 10-2014-0079949

(51) Int. Cl.
*G11C 11/00* (2006.01)
*G11C 13/00* (2006.01)

(52) U.S. Cl.
CPC ........ *G11C 13/0069* (2013.01); *G11C 13/0064* (2013.01)

(58) Field of Classification Search
CPC ....................................... G11C 11/00
USPC ............. 365/46, 94, 100, 129, 148, 158, 163; 257/2–5, 9, 295, 310, E21.35; 438/95, 438/96, 135, 166, 240, 365, 482, 486, 597, 438/785

See application file for complete search history.

(56) References Cited

U.S. PATENT DOCUMENTS

| | | | |
|---|---|---|---|
| 6,791,873 B1 | 9/2004 | Perner | |
| 7,573,758 B2 | 8/2009 | Park et al. | |
| 8,116,117 B2 | 2/2012 | Cho et al. | |
| 8,184,470 B2 | 5/2012 | Toda et al. | |
| 8,199,581 B2 | 6/2012 | Kim | |
| 8,233,318 B2 | 7/2012 | Ramani et al. | |
| 8,315,082 B2 | 11/2012 | Toda | |
| 2008/0291715 A1* | 11/2008 | Park et al. | ............ 365/148 |
| 2010/0027326 A1* | 2/2010 | Kim et al. | ............ 365/163 |
| 2010/0103726 A1* | 4/2010 | Bae et al. | ............ 365/163 |
| 2010/0214831 A1 | 8/2010 | Kim et al. | |
| 2010/0214837 A1* | 8/2010 | Sako et al. | ......... 365/185.03 |
| 2011/0188292 A1 | 8/2011 | Joo et al. | |
| 2012/0033489 A1* | 2/2012 | Song et al. | ............ 365/163 |
| 2012/0163092 A1 | 6/2012 | Jung et al. | |

* cited by examiner

*Primary Examiner* — Harry W Byrne
(74) *Attorney, Agent, or Firm* — Volentine & Whitt, PLLC

(57) ABSTRACT

A method of programming memory cells of a resistive memory device includes; applying a first current pulse to each of the plurality of memory cells; applying a second current pulse that increases by a first difference compared to the first current pulse to each of the plurality of memory cells to which the first current pulse is applied; and applying a third current pulse that increases by a second difference compared to the second current pulse to each of the plurality of memory cells to which the second current pulse is applied, wherein the first through third current pulses non-linearly increase, and the second difference is greater than the first difference.

20 Claims, 19 Drawing Sheets

RESISTIVE MEMORY DEVICE AND METHOD PROGRAMMING SAME

CROSS-REFERENCE TO RELATED APPLICATION

This application claims the benefit of Korean Patent Application No. 10-2014-0079949 filed on Jun. 27, 2014, the subject matter of which is hereby incorporated by reference.

BACKGROUND

The inventive concept relates generally to memory devices and methods of operating same. More particularly, the inventive concept relates to resistive memory devices, memory systems including at least one resistive memory device, and methods of operating same.

Ongoing research and development efforts seek to provide next generation memory devices having nonvolatile data storage characteristics, high memory cell integration density, high operating speeds, and low power consumption. That is, next generation memory devices should provide the memory cell integration density of dynamic random access memory (DRAM) devices, the nonvolatile data storage capabilities of flash memory devices, and the high operating speed of static random access memory (SRAM) devices. Phase change random access memory (PRAM or PcRAM) devices, nano floating gate memory (NFGM) devices, polymer random access memory (PoRAM) devices, magnetic random access memory (MRAM) devices, ferroelectric random access memory (FRAM or FeRAM) devices and resistive random access memory (RRAM or ReRAM) devices are attracting much attention as the next generation memory devices potentially meeting the foregoing design requirements.

SUMMARY

The inventive concept provides a method of operating a resistive memory device that performs a write operation to the resistive memory device according to a physical characteristic of the resistive memory device, thereby increasing efficiency of the write operation.

The inventive concept also provides a resistive memory device that performs a write operation to the resistive memory device according to a physical characteristic of the resistive memory device, thereby increasing efficiency of the write operation.

According to an aspect of the inventive concept, there is provided a method of operating a resistive memory device including a plurality of memory cells, the method including applying a first current pulse to each of the plurality of memory cells; applying a second current pulse that increases by a first difference compared to the first current pulse to each of the plurality of memory cells to which the first current pulse is applied; and applying a third current pulse that increases by a second difference compared to the second current pulse to each of the plurality of memory cells to which the second current pulse is applied, wherein the first through third current pulses non-linearly increase, and the second difference is greater than the first difference.

A set program operation on the plurality of memory cells may be performed by sequentially applying the first through third current pulses to each of the plurality of memory cells, and thus a resistance of each of the plurality of memory cells is reduced.

The plurality of memory cells may have first through third distributions according to read currents, respectively, as a result of applying the first through third current pulses to the plurality of memory cells, the method further including: before applying the first current pulse, determining the first through third current pulses in order that a first current difference between a minimum current level of the first distribution and a minimum current level of the second distribution is substantially the same as a second current difference between the minimum current level of the second distribution and a minimum current level of the third distribution.

The first through third current pulses may be determined in order that the first and second current differences are substantially the same as current widths of target distributions according to a target resistance state of the plurality of memory cells.

The plurality of memory cells may have first through third distributions according to read resistances, respectively, as a result of applying the first through third current pulses to the plurality of memory cells, the method further including: before applying the first current pulse, determining the first through third current pulses in order that a first resistance difference between a maximum resistance level of the first distribution and a maximum resistance level of the second distribution is substantially the same as a second resistance difference between the maximum resistance level of the second distribution and a maximum resistance level of the third distribution.

The first through third current pulses may be determined in order that the first and second resistance differences are substantially the same as current widths of target distributions according to a target resistance state of the plurality of memory cells.

The first current pulse may have a first amplitude and a first pulse width, the second current pulse has a second amplitude and a second pulse width, and the third current pulse has a third amplitude and a third pulse width, wherein the first difference includes at least one of a difference between the first amplitude and the second amplitude and a difference between the first pulse width and the second pulse width, and the second difference includes at least one of a difference between the second amplitude and the third amplitude and a difference between the second pulse width and the third pulse width.

The method may further include: at least one of performing a verify read operation on the plurality of memory cells to which the first current pulse is applied, and performing the verify read operation on the plurality of memory cells to which the second current pulse is applied, wherein the second current pulse or the third current pulse is applied to some of the plurality of memory cells of which programming has not been completely performed as a result of performing the verify read operation.

Each of the plurality of memory cells may have one of a plurality of resistance states, wherein the greater a resistance state difference between an initial resistance state of each of the plurality of memory cells and a target resistance state with respect to data that is to be programmed, the greater the first and second differences.

Each of the plurality of memory cells may have one of a plurality of resistance states, wherein the greater a resistance state difference between an initial resistance state of each of the plurality of memory cells and a target resistance state with respect to data that is to be programmed, the greater an increment between the first and second differences.

According to another aspect of the inventive concept, there is provided a method of operating a resistive memory device including a plurality of memory cells each having one of a plurality of resistance states, the method including: determining first through Nth current pulses that non-linearly increase, based on a resistance state difference between an initial resistance state of each of the plurality of memory cells and a target resistance state with respect to data that is to be programmed; and sequentially applying the first through Nth current pulses to the plurality of memory cells, wherein an increase range between the first through Nth current pulses increases according to an increase in an N value, and N is a natural number greater than 2.

The first through Nth current pulses may be determined in order that the greater the resistance state difference between the initial resistance state and the target resistance state, the greater an increase range between the first through Nth current pulses.

The increase range between the first through Nth current pulses may be an increase amount of at least one of amplitude and width of each of the first through Nth current pulses.

The determining of the first through Nth current pulses may include: determining the second current pulse having a value that increases by a first difference compared to the first current pulse, and determining the third current pulse having a value that increases by a second difference compared to the second current pulse, wherein the second difference is greater than the first difference.

The greater the resistance state difference, the greater N.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
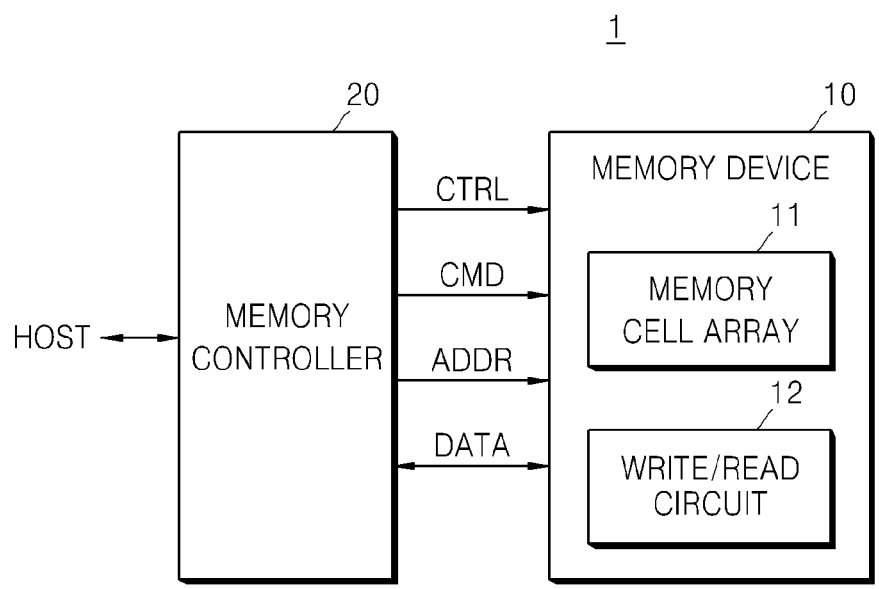
FIG. 1 is a general block diagram of a memory system according to an embodiment of the inventive concept.

Hereinafter, embodiments of the inventive concept will be described in some additional detail with reference to the accompanying drawings. These embodiments are provided so that this disclosure will be thorough and complete, and will fully convey the scope of the inventive concept to one of ordinary skill in the art. As the inventive concept allows for various changes and numerous embodiments, only particular embodiments will be illustrated in the drawings and described in the following written description. However, this is not intended to limit the inventive concept to particular modes of practice, and it is to be appreciated that all changes, equivalents, and substitutes that do not depart from the technical scope of the inventive concept are encompassed in the inventive concept. Throughout the written description and drawings, like reference numbers and labels denote like or similar elements. The illustrated thickness (or relative thickness) of materials layers in the drawings may be exaggerated for clarity.

The terms used in the specification are merely used to describe particular embodiments, and are not intended to limit the inventive concept. An expression used in the singular encompasses the expression in the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

While such terms as "first," "second," etc., may be used to describe various components, such components are not be limited to the above terms. The above terms are used only to distinguish one component from another. For example, a first component discussed below could be termed a second component, and similarly, a second component may be termed a first component without departing from the teachings of this disclosure.

Unless defined differently, all terms used in the description including technical and scientific terms have the same meaning as generally understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Figure (FIG. 1 is a block diagram of a memory system 1 according to an embodiment of the inventive concept.

Referring to FIG. 1, the memory system 1 generally comprises a memory device 10 and a memory controller 20, where the memory device 10 includes a memory cell array 11 and a write/read circuit 12.

The memory controller 20 may be used to control the memory device 10 such that "read data" may be retrieved from the memory device 10, and/or externally-provided "write data" may be stored in the memory device 10 in response to read/write request(s) received from a host. In this regard, the memory controller 20 may provide the memory device 10 with an address signal ADDR, a command signal CMD and a control signal CTRL to control the execution of a program, write, erase operations. Write data (DATA) to be programmed to the memory device 10 will also be communicated from the memory controller 20 to the memory device 10 during a program operation. Read data (DATA) retrieved from the memory device 10 will be communicated to the memory controller 20 during a read operation.

Although not shown in the drawings, the memory controller 20 may be configured to include a Random Access Memory (RAM) device, a processing unit, a host interface, and a memory interface, where the RAM device may be used as an operation memory by the processing unit and the processing unit controls the overall operation of the memory controller 20. The host interface may include a protocol for data exchange between the host and the memory controller 20. For example, the memory controller 20 may be configured to communicate with an external system (e.g., the host) through at least one selected from various interface protocols, such as a universal serial bus (USB), a multi-media card (MMC), a peripheral component interconnect express (PCI-E), an advanced technology attachment (ATA), a serial-ATA, a parallel-ATA, a small computer system interface (SCSI), an enhanced small device interface (ESDI), and an integrated drive (or device) electronics (IDE).

The memory cell array 11 includes a plurality of memory cells (not shown) respectively disposed at intersections of first signal lines and second signal lines. In some embodiments, the first signal lines may be bit lines and the second signal lines may be word lines. Alternatively, the first signal lines may be word lines and the second signal lines may be bit lines.

In certain embodiments of the inventive concept, memory cells may be resistive memory cells, each having a variable resistor capable of being programmed to exhibit a variable resistance. For example, when the variable resistor is formed of a phase change material (e.g., Ge—Sb—Te (GST)) and resistance thereof changes according to an applied heating temperature, the memory device 10 may be a phase change RAM (PRAM). In another example, when the variable resistor may include an upper electrode, a lower electrode and transition metal oxide between the upper and lower electrodes, the memory device 10 may be a resistive RAM (RRAM). In another example, when the variable resistor includes an upper electrode of a magnetic material, a lower electrode of the magnetic material, and a dielectric material between the upper and lower electrodes, the memory device 10 may be a magnetic RAM (MRAM).

The write/read circuit 12 may be used to perform an iterative sequence of program loops in relation to memory cells selected for programming during a program operation. In certain embodiments of the inventive concept, each program loop will include a program operation (or write operation) followed by a verify operation. In other embodiments of the inventive concept, one or more of the program loops will include only the program operation.

Thus, the write/read circuit 12 may be used to control the execution of a program operation directed to selected memory cells by sequentially applying first through Nth current pulses to the memory cells, where N is a natural number greater than one. This sequence of first through Nth current pulses is said to be "non-linearly increasing" with each successive program loop iteration. One type of program operation is referred to as a "set operation" where one or more resistive memory cells are programmed in a set direction, thereby decreasing the resistance of the memory cell(s). Another type of program operation is referred to as a "reset operation" where one or more resistive memory cells are programmed in a reset direction, thereby increasing the resistance of the memory cell(s).

Thus, during a program operation the write/read circuit 12 will cause a first program loop to be executed by applying a first current pulse to selected memory cells, and then a second program loop to be executed by applying a second current pulse to the selected memory cells, where the first current pulse is less than the second current pulse by a "first pulse difference". Additionally after the second program loop, the write/read circuit 12 may also cause a third program loop to be executed by applying a third current pulse to the selected memory cells, where the second current pulse is less than the third current pulse by a "second pulse difference" and second pulse difference is greater than the first pulse difference.

In the context of FIG. 1, the memory controller 20 and memory device 10 may be commonly integrated as a single semiconductor device. For example, the memory controller 20 and memory device 10 may be integrated as a single semiconductor device configured as a memory card, such as a personal computer memory card international association (PCMCIA) card, a compact flash (CF) card, a smart media card (SMC), a memory stick, a multi-media card (MMC) such as a reduced size multi-media card (RS-MMC) or a MMCmicro, a secure digital (SD) card such as a mini-CD card or a micro-CD card, or a universal flash storage (UFS). Alternatively, the memory controller 20 and memory device 10 may be integrated as a single semiconductor device configured as a solid state drive (SSD) system.

Figure 2:
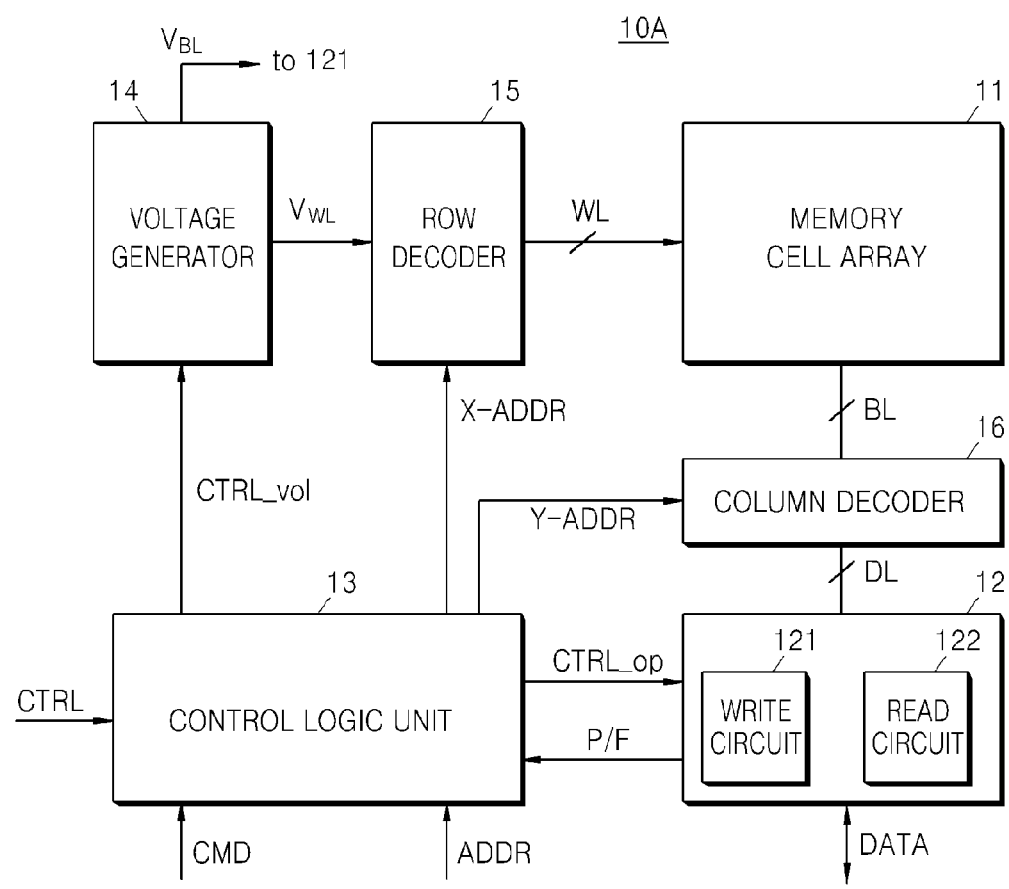
FIG. 2 is a block diagram further illustrating in one example (10A) the memory device of FIG. 1.

FIG. 2 is a block diagram further illustrating in one example (10A) the memory device 10 of FIG. 1.

Referring to FIG. 2, the memory device 10A comprises in addition to the memory cell array 11 and write/read circuit 12, control logic unit 13, a voltage generator 14, a row decoder 15, and a column decoder 16. In the embodiment illustrated in FIG. 2, the write/read circuit 12 is shown as including a write circuit 121 and a read circuit 122, however those skilled in the art will understand that the memory device 10A may be variously embodied.

As previously noted, the constituent memory cells of the memory cell array 11 may be connected in a matrix formed by first signal lines and second signal lines. Hereinafter, embodiments of the inventive concept will be described in conjunction with an assumption that the first signal lines are bit lines BL and the second signal lines are word lines WL.

Figure 3:
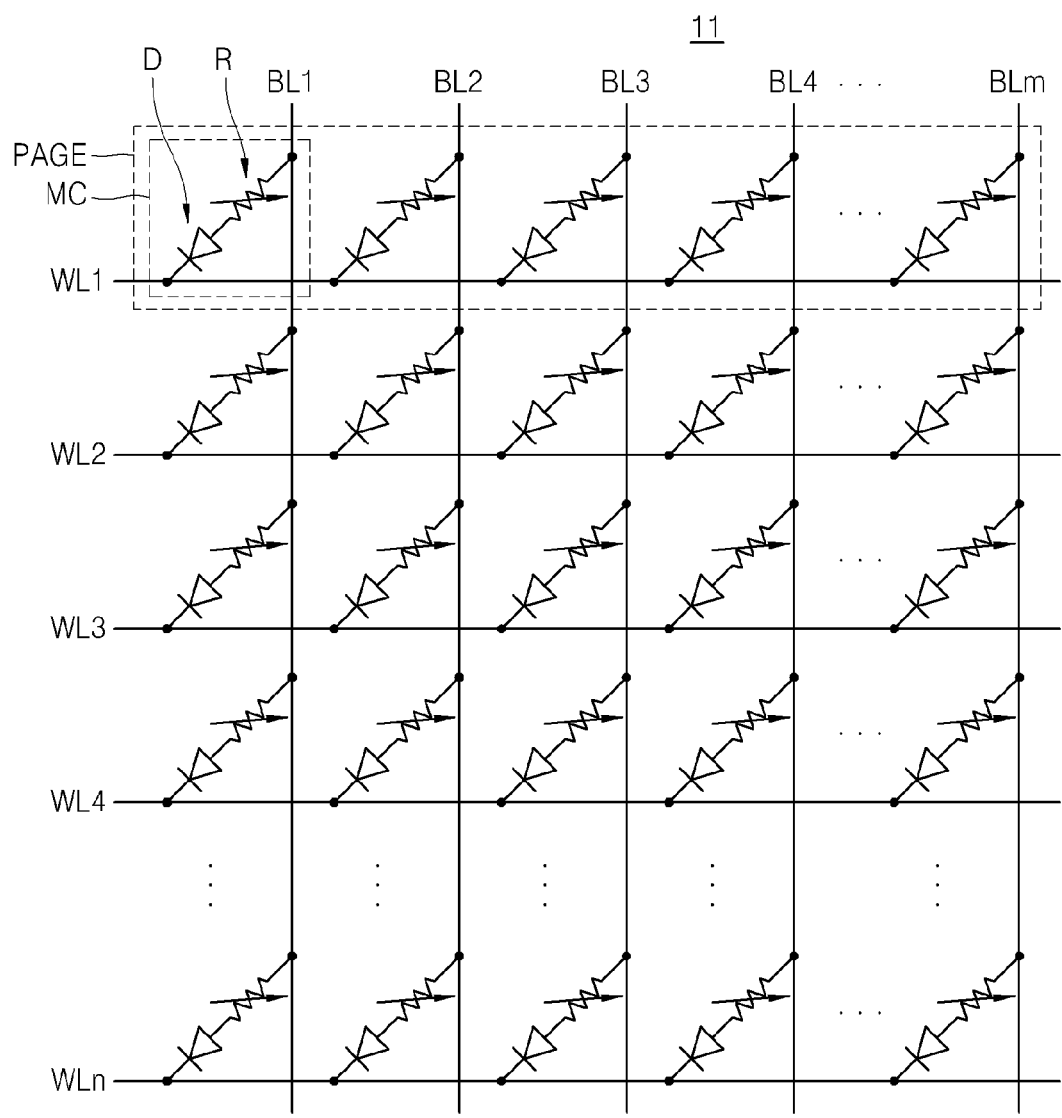
FIG. 3 is a partial circuit diagram further illustrating in one example the memory cell array 11 of FIG. 2.

FIG. 3 is a partial circuit diagram illustrating one possible configuration for the memory cell array 11 of FIG. 2.

Referring to FIG. 3, the memory cell array 11 is assumed to be a horizontal or two-dimensional structure including a plurality of word lines WL1, . . . , and WLn, a plurality of bit lines BL1, . . . , and BLm, and a plurality of memory cells MC. In this regard, the number of word lines WL1, . . . , and WLn, the number of bit lines BL1, . . . , and BLm, and the number of memory cells MC will vary according to embodiment. However, the inventive concept is not limited to the above configuration, and the memory cell array 11 might alternately be configured as a vertical or three-dimensional structure.

According to the embodiment illustrated in FIG. 3, each of the memory cells MC includes a variable resistance device R and a selection device D. The variable resistance device R may be referred to as (or as including) a variable resistance material and the selection device D may be referred to as a switching element.

For example, each of the variable resistance devices R may be coupled between one of the bit lines BL1, . . . , and BLm and one of the selection devices D, and each of the selection devices D may be coupled between one of the word lines WL1, . . . , and WLn and one of the variable resistance devices R. However, the inventive concept is not limited to only this configuration, and each of the selection devices D may be coupled between one of the bit lines BL1, . . . , and BLm and one of the variable resistance devices R and each of the variable resistance devices R may be coupled between one of the word lines WL1, . . . , and WLn and one of the selection devices D.

Each of the selection devices D is coupled between one of the word lines WL1 to WLn and one of the variable resistance devices R and may be used to control an amount of current flowing through the variable resistance devices R according to a voltage difference between the connected word line and the bit line. Although the selection device D is a diode in FIG. 3, this is merely one example of a several different types of switchable selection devices that may be used.

Figure 4:
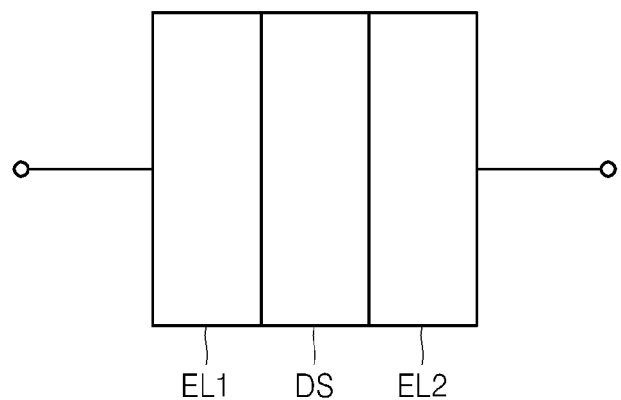
FIG. 4 illustrates one structural configuration that may be used to implement a variable resistance device included in the memory cell of FIG. 3.

FIG. 4 illustrates one example of the variable resistance device R that may be included in the memory cell MC of FIG. 3.

Referring to FIG. 4, the variable resistance device R comprises a first electrode EL1, a second electrode EL2, and a data storage film DS disposed between the first and second electrodes EL1 and EL2.

The first and second electrodes EL1 and EL2 may be formed of any of various metal materials, or metal oxide, or metal nitride. For example, the first and second electrodes EL1 and EL2 may be formed of aluminum (Al), copper (Cu), titanium nitride (TiN), titanium aluminum nitride (TixAlyNz), iridium (Ir), platinum (Pt), silver (Ag), gold (Au), polysilicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconium (Zr), zinc (Zn), iridium oxide (IrO2) or strontium zirconium oxide (SrZrO3).

The data storage film DS may be formed of a bipolar resistive storage material or a unipolar resistive storage material. The bipolar resistive storage material may be programmed to have a set state or a reset state according to a polarity of a pulse applied thereto. Perovskite-based materials may be used as the bipolar resistive storage material. The unipolar resistive storage material may be programmed to have a set state or a reset state even by pulses having the same polarity. Transition metal oxide materials such as a nickel oxide (NiOx) material and a titanium oxide (TiOx) material may be used as the unipolar resistive storage material.

FIGS. 5A, 5B 5C and 5D are respective circuit diagrams illustrating possible connections that may be used in relation to the memory cell MC of FIG. 4.

Figure 5A:
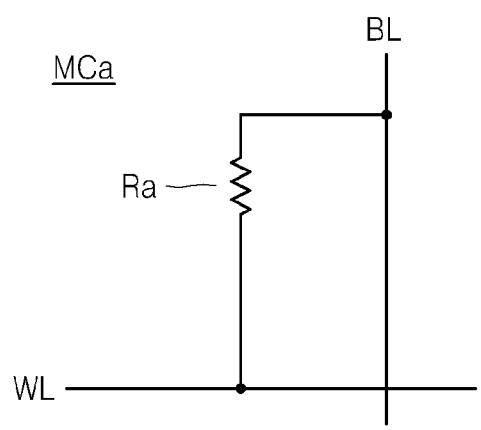
FIGS. 5A, 5B, 5C and 5D are respective circuit diagrams illustrating connection examples for the memory cell of FIGS. 3 and 4.

Referring to FIG. 5A, a memory cell MCa includes a variable resistance device Ra, and the variable resistance device Ra may be coupled between a bit line BL and a word line WL. Here, the memory cell MCa may be programmed by voltage signals respectively applied to the bit line BL and the word line WL.

Figure 5B:
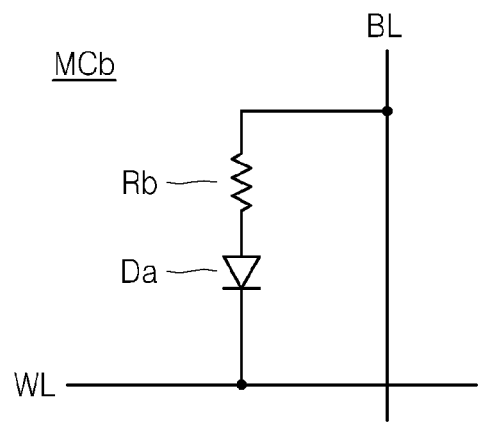

Referring to FIG. 5B, a memory cell MCb includes a variable resistance device Rb and a unidirectional diode Da which are connected in series. The variable resistance device Rb may include a resistive material for storing data. The unidirectional diode Da may be a selection element, that is, a switching element that supplies or blocks a current to the variable resistance device Rb according to a bias condition between the word line WL and the bit line BL. The unidirectional diode Da may be coupled between the variable resistance device Rb and word line WL, and the variable resistance device Rb may be coupled between the unidirectional diode Da and bit line BL. The locations of the unidirectional diode Da and variable resistance device Rb may be switched.

Thus, the unidirectional diode Da may be a PN diode or PIN diode and have an anode connected to the variable resistance device Rb and a cathode connected to one of the word lines WL1 through WLn. In this regard, if a voltage difference between the anode and the cathode of the unidirectional diode Da is higher than a threshold voltage thereof, the unidirectional diode Da may be turned ON to supply a current to the variable resistance device Ra.

Figure 5C:
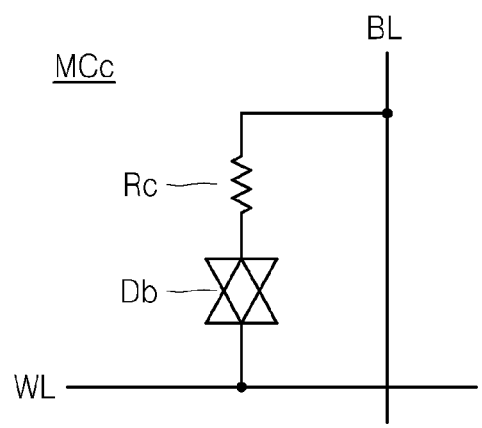

Referring to FIG. 5C, a memory cell MCc includes a variable resistance device Rc and a bidirectional diode Db. The variable resistance device Rc may include a resistive material for storing data. The bidirectional diode Db may be coupled between the variable resistance device Rc and the word line WL, and the variable resistance device Rc may be coupled between the bidirectional diode Db and the bit line BL. Locations of the bidirectional diode Db and the variable resistance device Rc may be switched. The bidirectional diode Db may prevent a leakage current from flowing through a non-selected memory cell.

Figure 5D:
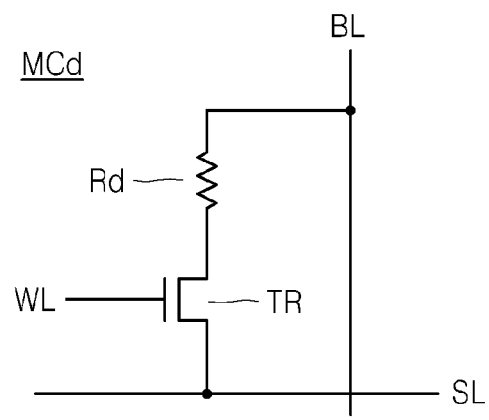

Referring to FIG. 5D, a memory cell MCd includes a variable resistance device Rd series connected with a transistor TR. The transistor TR may be a selection device, that is, a switching device that supplies or blocks a current to the variable resistance device Rd in response to a voltage level applied to the word line WL. The transistor TR may be coupled between the variable resistance device Rd and the word line WL, and the variable resistance device Rd may be coupled between the transistor TR and the bit line BL. Locations of the transistor TR and the variable resistance device Rd may be switched. The memory cell MCd may be selected or non-selected according to whether the transistor TR driven by the word line WL is turned ON/OFF.

Referring back to FIG. 2, the write circuit 121 may be used to control the execution of a program operation by providing a properly defined program pulse to a selected memory cell MC connected to a selected bit line BL to thereby store write data (DATA) in the memory cell array 11. In this regard, the program pulse may be referred to as a "write pulse". In various embodiments of the inventive concept, the program pulse may be a current pulse, or a voltage pulse.

Thus, the write circuit 121 may perform a set write operation that programs the memory cell MC in a direction in which resistance of the memory cell MC decreases. The write circuit 121 may perform a reset write operation that programs the memory cell MC in a direction in which the resistance of the memory cell MC increases. To do this, the write circuit 121 may sequentially provide first through Nth current pulses to the selected memory cell MC, where the first through Nth current pulses have respective current levels that non-linearly increase with each successively executed program loop. That is, the write circuit 121 may sequentially provide the first through Nth current pulses that non-linearly increase to the memory cell MC to thereby perform the set write operation on the memory cell MC. Alternately, the write circuit 121 may sequentially provide the first through Nth current pulses that non-linearly increase to the memory cell MC to thereby perform the reset write operation on the memory cell MC.

The read circuit 122 may be used to read the read data (DATA) from the selected memory cell MC connected to a selected bit line BL and provide the read data to an external circuit, such as memory controller 20. Thus, the read circuit 122 may perform a general read operation on the memory cell MC when a read command is received from the memory controller 20. Before performing a write operation on the memory cell MC, the read circuit 122 may perform a so-called "pre-read operation" on the memory cell MC in relation to an initial resistance state Ri of the memory cell MC.

In addition, the read circuit 122 may be used to perform a verify read operation that determines whether a program operation previously executed in relation to the memory cell MC has been successfully completed. Thus, the read circuit 122 may be used to determine the relative resistance of each of the memory cells MC to which write pulses are applied during a program operation and to provide corresponding read result to the write circuit 121 or control logic unit 13.

During a general read operation, the read circuit 122 may provide read data to a circuit external to the memory device 10A, such as the memory controller 20. During a pre-read operation or verify read operation, the read circuit 122 may provide read data to internal circuitry of the memory device 10A, such as control logic unit 13 or the write circuit 121. In certain embodiments, a pass/fail signal (P/F) may be used to indicate the success or failure of the program operation.

The control logic unit 13 receives the command signal CMD, address signal ADDR, and/or control signal CTRL from the memory controller 20 and generates various control signals used to control the programming of data to the memory cell array 11, or the reading of data from the memory cell array 11. Such control signals provided by the control logic unit 13 may be variously provided to the write/read circuit 12, voltage generator 14, row decoder 15, and column decoder 16 to thereby control the operation of the memory device 10A.

For example, the control logic unit 13 may provide various operation control signals (CTRL_op) to the write/read circuit 12, including for example, a write enable signal WEN, a read enable signal REN, a sense enable signal SEN, a discharge signal DIS, a precharge enable signal PRE, and a write control signal WCS. These exemplary operation control signals will be described hereafter in some additional detail with reference to FIG. 14.

In the foregoing context, the control logic unit 13 may provide a voltage control signal (CTRL_vol) to the voltage generator 14, a row address signal (X_ADDR) to the row decoder 15 and a column address signal (Y_ADDR) to the column decoder 16.

In this manner, the control logic unit 13 may determine (or define the nature of) the first through Nth current pulses provided by the write circuit 121 to the selected memory cell(s). In this regard, the first through Mth current pulses may be non-linearly related according to program loop iteration. That is, the control logic unit 13 may generate the voltage control signal (CTRL_vol) such that the voltage generator 14 generates first through Nth control voltages corresponding to the first through Nth current pulses.

In the illustrated embodiment of FIG. 2, the control logic unit 13 may be used to determine the first through Nth current pulses based on a "resistance difference" between the initial resistance state Ri of a memory cell MC and a target resistance state Rt in view of the data state of write data to be programmed to the memory cell MC. Hence, the control logic unit 13 may determine the first through Nth current pulses such that the greater the resistance difference, the greater the increasing range of the first through Nth current pulses. The control logic unit 13 may generate the voltage control signal such that the voltage generator 14 may generate the first through Nth control voltages corresponding to the first through Nth current pulses.

The voltage generator 14 may receive the voltage control signal to generate various control signals used to control the execution of write, read and erase operations directed to the memory cells of the memory cell array 11. For example, the voltage generator 14 may generate a first drive voltage signal VWL for driving the word lines WL and a second drive voltage signal VBL for driving the bit lines BL.

In this regard, the first drive voltage signal VWL may be a reset write voltage signal (Vreset), an inhibition voltage signal (Vinh), a read voltage signal (Vread), or a program revivify voltage signal (Vver). The second drive voltage signal VBL may be a set write voltage signal (Vset), reset write voltage signal (Vreset), inhibition voltage signal (Vinh), or a control voltage signal.

In FIG. 2, the row decoder 15 is connected to the memory cell array 11 via the plurality of word lines WL and may be used to activate a selected word line from among the plurality of word lines WL in response to the row address signal (X_ADDR) received from the control logic unit 13. Thus, the row decoder 15 may be used to control the control voltage applied to the selected word line WL and thereby control a connection relationship of the selected word line WL in response to the row address signal.

The column decoder 16 is connected to the memory cell array 11 via the plurality of bit lines BL and may be used to activate a selected bit line from among the plurality of bit lines BL in response to the column address signal received from the control logic unit 13. Thus, the column decoder 16 may be used to control the control voltage applied to the selected bit line BL to thereby control a connection relationship of the selected bit line WL in response to the column address signal.

Figure 6:
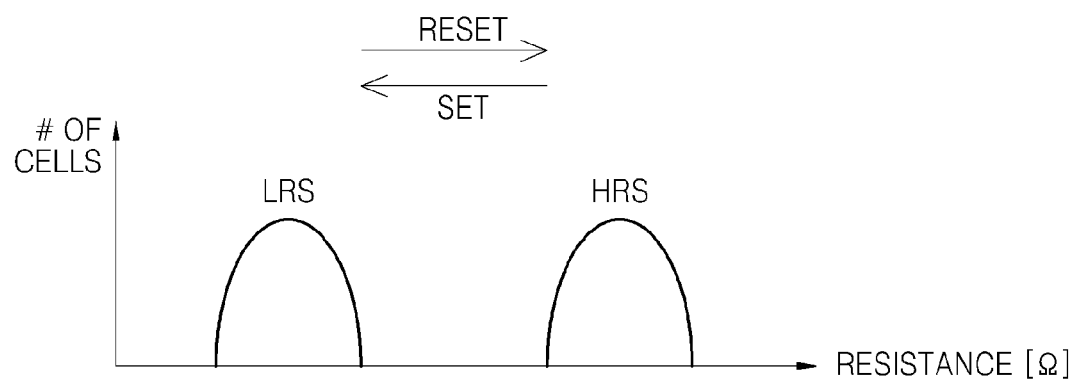
FIG. 6 is a graph illustrating distributions for memory cells with respect to resistance when the memory cell of FIG. 3 is a single level cell (SLC)

FIG. 6 is a graph showing possible distributions for the memory cells MC with respect to resistance when the memory cell MC of FIG. 3 is a single level cell (SLC), where the horizontal axis indicates resistance and the vertical axis indicates a number of the memory cells MC. Assuming the memory cell MC is configured to operate as a SLC, the memory cell MC will exhibit either a low resistance state LRS or a high resistance state HRS, where low resistance state LRS and the high resistance state HRS may be respectively interrupted as corresponding to a data value of "0" and a data value of "1".

Thus, during a program operation, one or more write pulse(s) may be applied to the memory cell MC switching the memory cell MC resistance between the high resistance state HRS and low resistance state LRS depending on whether the program operation was a set write operation or a reset write operation.

Figure 7:
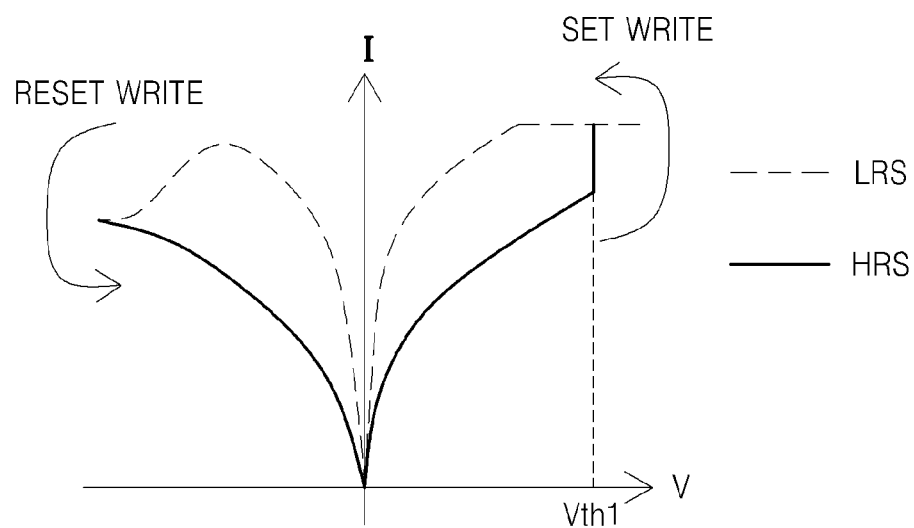
FIG. 7 is a graph illustrating a voltage-current characteristic curve for a memory cell having the SLC distributions of FIG. 6.

FIG. 7 is a graph illustrating a voltage-current characteristic curve for the memory cell MC of FIG. 3 having the distributions of FIG. 6, where the horizontal axis indicates memory cell voltage V and the vertical axis indicates current I. When the memory cell MC is the SLC, the memory cell MC will exhibit either the low resistance state LRS or the high resistance state HRS in accordance with a stored data value.

When the memory cell MC is in the high resistance state HRS, if a voltage higher than a threshold voltage Vth1 is applied to the memory cell MC, since current of the memory cell MC rapidly increases, it is not easy to control the current used to program (or write) a resistance level with respect to data being programmed, and the memory cell MC may possibly be damaged due to the rapidly increased current. Thus, consistent with embodiments of the inventive concept, when a set write operation is performed on the memory cell MC a current pulse is applied to the memory cell MC, and when a reset write operation is performed on the memory cell MC, a voltage pulse or the current pulse is applied to the memory cell MC.

Figure 8A:
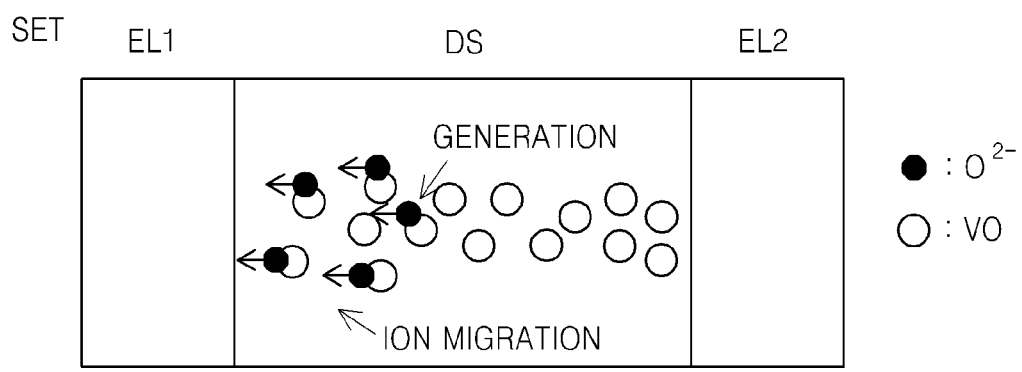
FIGS. 8A and 8B are conceptual diagrams respectively illustrating a set operation and a reset operation for the memory cell of FIG. 3.
Figure 8B:
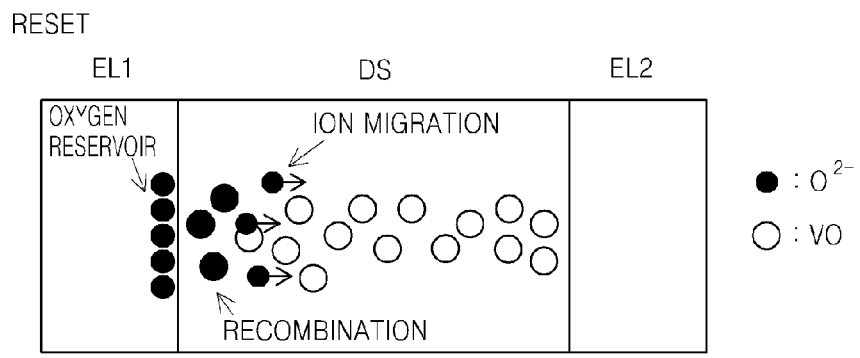

FIGS. 8A and 8B are conceptual diagrams respectively illustrating a set operation and a reset operation with respect to one or more memory cells MC of FIG. 3 (hereafter, singularly or collectively, "memory cells").

Referring to FIG. 8A, when a set operation is performed on the memory cells, (e.g., when write current pulses are applied), the voltage applied to the first electrode EL1 will be higher than that applied to the second electrode EL2. Under the influence of this voltage differential between the first electrode EL1 and second electrode EL2, oxygen ions (O2-) and voids (VO) are separated from each other in the data storage film DS (e.g., a metal oxide film), and an ion migration phenomenon occurs and the separated oxygen ions move towards the first electrode EL1.

In response to the ion migration phenomenon, a filament including the voids will be generated in the data storage film DS. The thickness and density of the filament is a function of the level (i.e., amplitude) and duration (i.e., width) of the write current pulse applied to the memory cell MC, and the resulting filament will define in large part the resistance level R of the memory cells.

In this regard, the number of current pulses necessary to effectively separate the oxygen ions and voids varies non-linearly in relation to the material used to form the data storage film DS. Thus, when linearly increasing current pulses are applied over a defined range of resistance distributions, the resulting separation of oxygen ions and voids does not increase in a correspondingly linear manner. As a result of this outcome, the thickness and density of the filament created by the migration of oxygen ions and voids will not linearly increase in the data storage film DS. This makes it very difficult to linearly change the resistance level R of the memory cell MC in a predictable, controllable (e.g., an iterative program loop by iterative program loop) manner using the application of current pulses having linearly increasing amplitudes.

In contrast, in the embodiments of the inventive concept, a set write operation may be performed by applying the current pulses having non-linearly increasing amplitudes to the memory cells. As described above, when a number of non-linearly increasing current pulses may be applied to the memory cells, the distribution of resistances for the memory cells being programmed will move at more uniform (and better predicted) increments in response each iterative program loop executed during the set write operation.

Referring to FIG. 8B, when a reset operation is performed on the memory cells (i.e., when write current pulses are applied), the voltage applied at the second electrode EL2 will be higher than that applied of the first electrode EL1. Thus, the ion migration phenomenon is essentially reversed and oxygen ions stored in the first electrode EL1 move towards the second electrode EL2 through the data storage film DS. That is, at least some of the oxygen ions begin to "recombine" with voids in the data storage film DS, thereby breaking down any filament formed in the data storage film DS.

Figure 9:
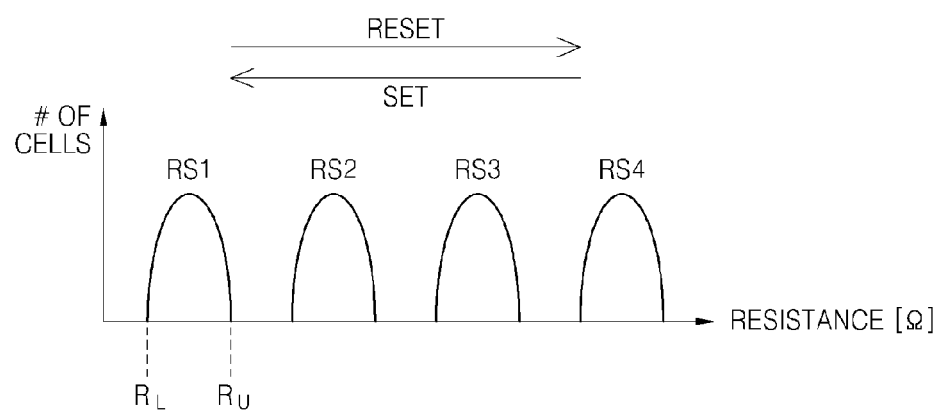
FIG. 9 is a graph illustrating distributions for memory cells with respect to resistance when the memory cell of FIG. 3 is a (2-bit) multi level cell (MLC)

FIG. 9 is a graph showing possible distributions for memory cells like those described in relation to FIG. 3 that are configured to operate as 2-bit, multi level cell (MLC), where the horizontal axis indicts a resistance value for the memory cells and the vertical axis indicates a number of memory cells MC. Thus, 2-bit MLC capable of programmed two bits of data per MLC may exhibit a first resistance state RS1, a second resistance state RS2, a third resistance state RS3, or a fourth resistance state RS4.

Those skilled in the art will recognize that the principles described hereafter with respect to the exemplary 2-bit MLC may be applied to 3-bit memory cells, 4-bit memory cells and higher.

In the case of MLCs as compared to SLCs, an interval between resistance states is narrow. This small resistance change may lead to occurrence of read errors of the MLCs. Thus, each of the first to fourth resistance states RS1, RS2, RS3 and RS4 may have a resistor range that does not overlap with each other so as to obtain a read margin.

The first, second, third and fourth resistance states (RS1, RS2, RS3 and RS4) may be respectively interrupted as corresponding to data states '00', '01', '10', and '11', where the resistance level R exhibited by the memory cells increases in the data state order '11', '01', '00', and '10', for example.

Figure 10:
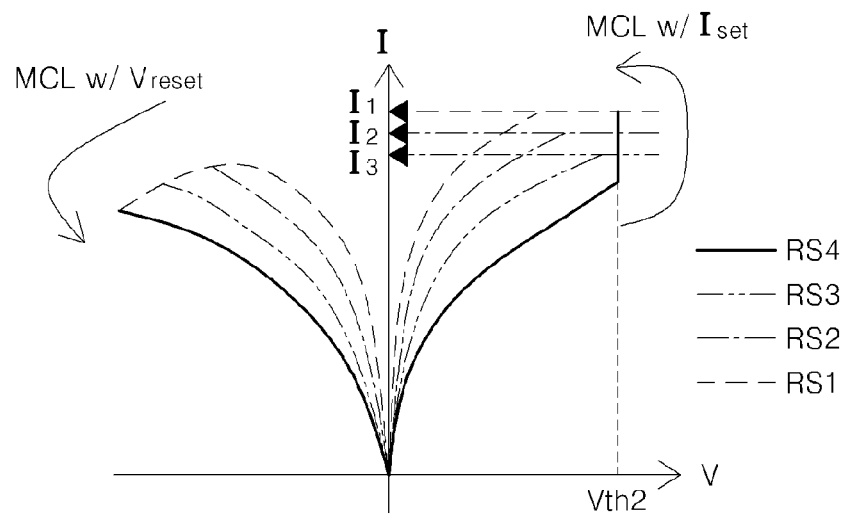
FIG. 10 is a graph illustrating a voltage-current characteristic curve for a memory cell having the MLC distributions of FIG. 9.

FIG. 10 is a graph illustrating a voltage-current characteristic curve for memory cells of FIG. 3 having the possible distributions of FIG. 9, where the horizontal axis indicates voltage V and the vertical axis indicates current I.

Consistent with the foregoing, the memory cells (e.g., MLC) may be programmed to one of the first resistance state RS1, second resistance state RS2, third resistance state RS3, or fourth resistance state RS4 in accordance with the state of the stored data.

Since the resistance of the memory cell MC is assumed to be highest in relation to the fourth resistance state RS4, should a voltage higher than a threshold voltage Vth2 be applied to the memory cells—bearing in mind that the current passing through of the memory cells will increase rapidly—it is not easy using conventional programming approaches to control the current used to write a particular resistance level with respect to write data being programmed.

However, in embodiments of the inventive concept, when a set write operation is performed on the memory cells, a write current pulse Iset may be applied to the memory cells. In response to the amplitude and/or duration of an applied write current pulse Iset, the memory cells may be switched from the fourth resistance state RS4, to one of the first resistance state RS1, second resistance state RS2, or third resistance state RS3. For example, if a first write current I1 is applied to the memory cells, the memory cells will be switched from the fourth resistance state RS4 to the first resistance state RS1, if a second write current I2 is applied to the memory cells, the memory cells will be switched from the fourth resistance state RS4 to the second resistance state RS2, and if a third write current I3 is applied to the memory cells, the memory cells will be switched from the fourth resistance state RS4 to the third resistance state RS3. Analogously, it is the duration and/or amplitude of the write current pulse Iset that determine whether the memory cells currently programmed to one of the four resistance states are switched to a different one of the resistance states.

Figure 11:
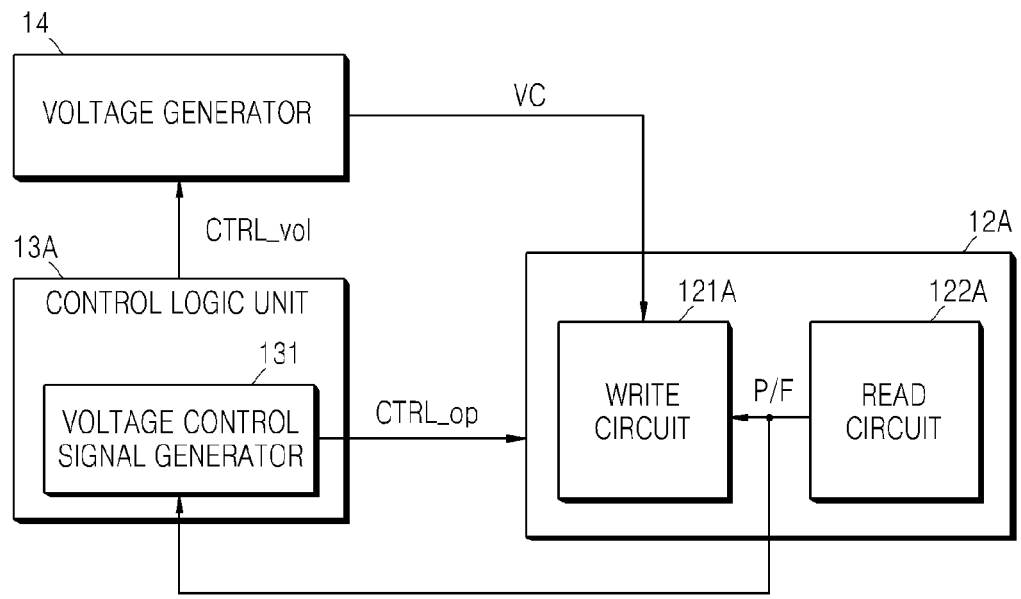
FIG. 11 is a block diagram further illustrating in one example the write/read circuit, control logic, and voltage generator of FIG. 2.

FIG. 11 is a block diagram illustrating in one example the write/read circuit 12, control logic unit 13, and voltage generator 14 of the memory device 10A of FIG. 2.

Referring to FIG. 11, control logic unit 13A is assumed to include a voltage control signal generator 131, and the write/read circuit 12A is assumed to include a write circuit 121A and a read circuit 122A.

Before performing the write operation on memory cells, the read circuit 122A will perform a pre-read operation by reading an initial resistance state Ri for the memory cells. Then, the read circuit 122A may compare the initial resistance state Ri determined during the pre-read operation with a target resistance state Rt in view of the write data to be written to the memory cells. Once the read circuit 122A determines whether the initial resistance state Ri is lower (or higher) than the target resistance state Rt, it will a comparison result to the control logic unit 13A in the form of (e.g.,) a pass/fail signal (P/F).

The voltage control signal generator 131 may be used to determine the first through Nth current pulses, such that as the number of iteratively-executed program loops increases, the first through Nth current pulses provided by the write circuit 121A will also increase in a non-linear manner. Thereafter, the voltage control signal generator 131 may generate the voltage control signal (CTRL_vol) such that the voltage generator 14 may grenade a first control voltage (VC) corresponding to the first current pulse.

Hence, the voltage control signal generator 131 may operate in response to a determined resistance difference between the initial resistance state Ri and target resistance state Rt, and therefore determine the first through Nth current pulses such that the greater the resistance difference, the greater the increase may be set between adjacent ones of the first through Nth current pulses. Thereafter, the voltage control signal generator 131 may generate the voltage control signal (CTRL_vol) such that the voltage generator 14 generates the first control voltage (VC) corresponding to the first current pulse.

Figure 12A:
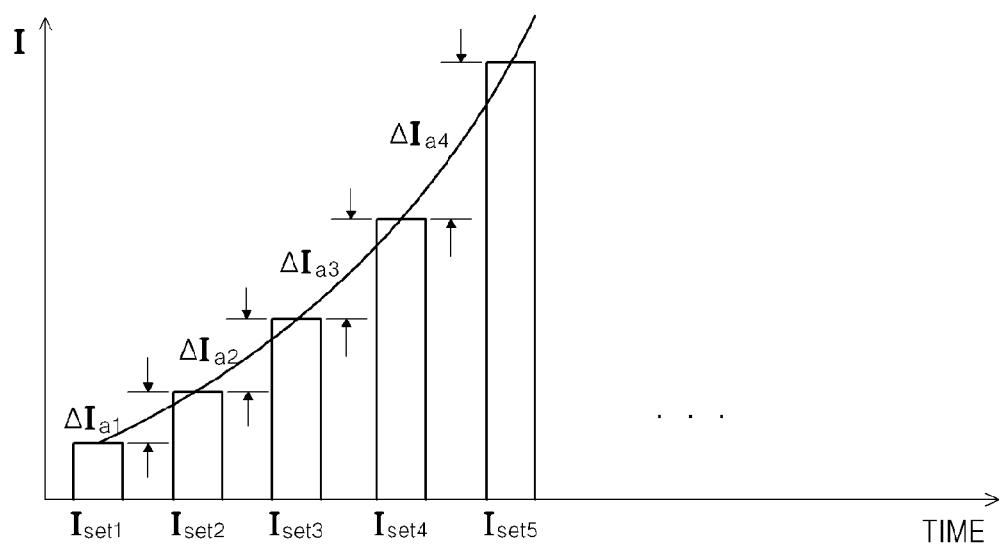
FIGS. 12A, 12B and 12C are respective graphs illustrating examples of first through Nth current pulses that may be determined by the voltage control signal generating unit of FIG. 11.
Figure 12B:
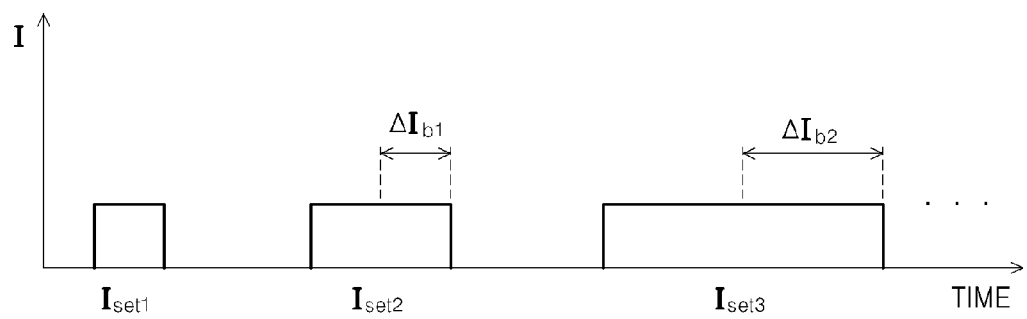
Figure 12C:
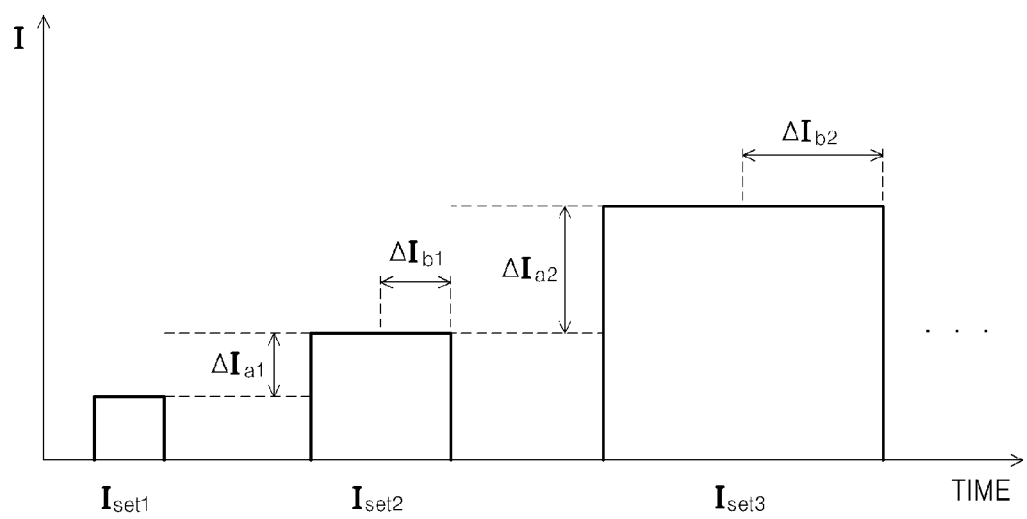

FIGS. 12A, 12B and 12C are graphs respectively illustrating examples of the first through Nth current pulses determined by the voltage control signal generating unit 131 of FIG. 11. In each graph, the horizontal axis indicates time T and the vertical axis indicates current pulse level I.

Referring to FIG. 12A, beginning with a first current pulse Iset1, successive current pulses (e.g., second current pulse Iset2 though fifth current pulse Iset5) are increased by an increasingly large amplitude increments (e.g., $\Delta Ia1$, $\Delta Ia2$, $\Delta Ia3$ and $\Delta Ia4$), such that Iset1<Iset2<Iset3<Iset4<Iset5 by respectively, and non-linearly increasing current pulse increments (i.e., $\Delta Ia1 < \Delta Ia2 < \Delta Ia3 < \Delta Ia4$).

In view of the description provided with respect to FIGS. 8A and 8B, since the amplitudes of the first through fifth current pulses (Iset1 ... Iset5) are non-linearly increased at an ever increasing increment, the voids of the data storage film DS more regularly increase with execution of each successive program loop, thereby allowing a more gradual and predictable increases in distribution for the memory cells and also increasing the speed of the write operation.

Referring to FIG. 12B, a first current pulse Iset1, a second current pulse Iset2, and a third current pulse Iset1 are successively generated with increasing durations (or width).

Thus, the width of the second current pulse Iset2 increases over the width of the first current pulse Iset1 by a first difference $\Delta Ib1$, yet the width of the third current pulse Iset3 increases over the width of the second difference by a second difference $\Delta Ib2$ greater than the first difference $\Delta Ib1$. And this type of nonlinearly-increasing of successive differences in width between adjacent current pulses in a sequence of applied current pulses may continue through the entire sequence with the same effects noted above for nonlinearly-increasing amplitudes differences.

Finally referring to FIG. 12C, both nonlinearly-increasing increments in current pulse amplitudes, as between adjacent current pulses in a sequence of current pulses, and nonlinearly-increasing increments in current pulse widths, as between adjacent current pulses in the sequence of current pulses may be used to generate successively iterated program loops moving a distribution of memory cells in a move predictable and linear manner, thereby improving the speed of the write operation.

Figure 13A:
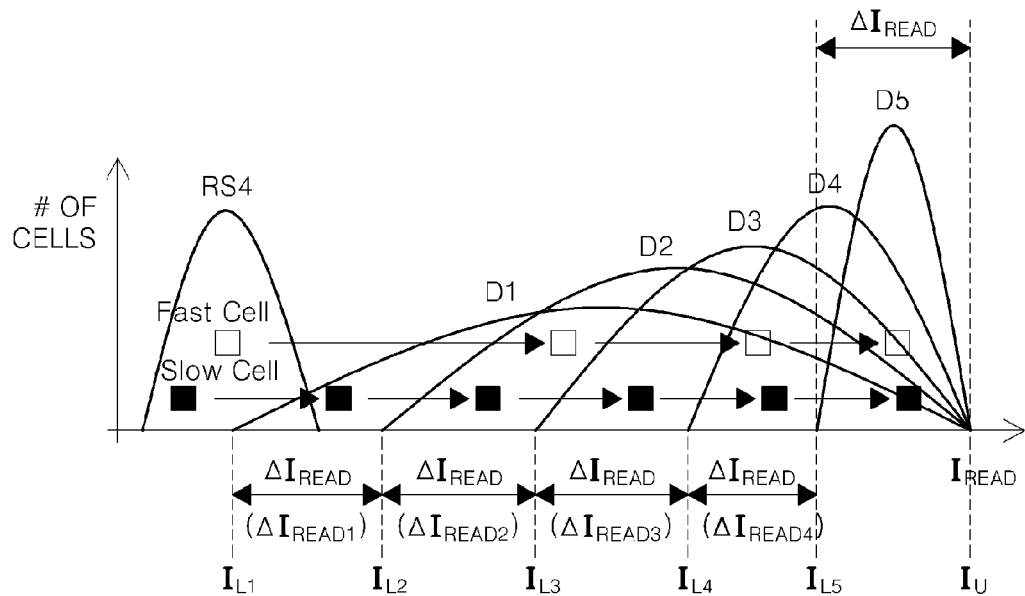
FIGS. 13A and 13B are graphs illustrating distributions of memory cells with respect to a number of program loops performed.
Figure 13B:
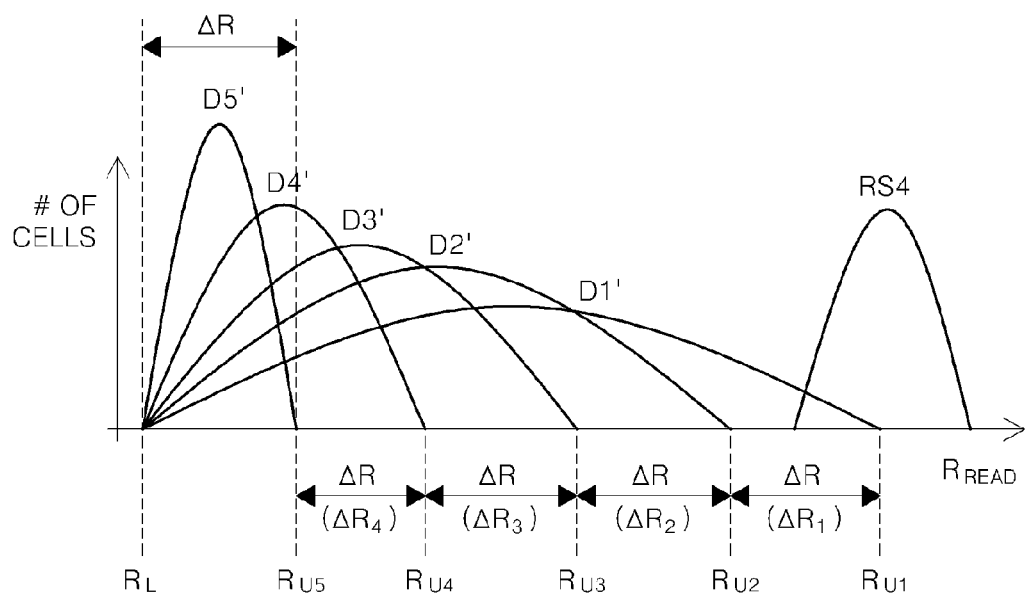

FIGS. 13A and 13B are graphs showing distributions D1, D2, D3, D4, D5, D1', D2', D3', D4', and D5' for memory cells with respect to executed program loops Referring to FIG. 13A, the horizontal axis indicates a read current Iread and the vertical axis indicates a number of the memory cells. Here, an initial resistance state Ri for the memory cells is assumed to be the fourth resistance state RS4, and a target resistance state Rt is assumed to be the first resistance state RS1.

D1 denotes a first distribution obtained by sequentially applying a first current pulse Iset1 and a verify pulse to the memory cells during a first program loop. D2 denotes a second distribution obtained by sequentially applying the second current pulse Iset2 and the verify pulse to the memory cells during a second program loop. D3 denotes a third distribution obtained by sequentially applying a third current pulse Iset3 and the verify pulse to the memory cells during a third program loop. D4 denotes a fourth distribution obtained by sequentially applying the fourth current pulse Iset4 and the verify pulse to the memory cells during a fourth program loop, and D5 denotes a fifth (and final) distribution obtained by sequentially applying a fifth current pulse Iset5 and the verify pulse to the memory cells during a fifth program loop.

A first current difference between a minimum current level IL1 associated with the first distribution D1 and a minimum current level IL2 associated with the second distribution D2 is $\Delta IREAD1$. A second current difference between the minimum current level IL2 associated with the second distribution D2 and a minimum current level IL3 associated with the third distribution D3 is $\Delta IREAD2$, and so on.

The voltage control signal generator 131 may be used to determine the first through fifth current pulses Iset1 through Iset5 such that the first through fourth current differences $\Delta IREAD1$, $\Delta IREAD2$, $\Delta IREAD3$, $\Delta IREAD4$ are substantially the same (i.e., $\Delta IREAD1 = \Delta IREAD2 = \Delta IREAD3 = \Delta IREAD4$). Accordingly, as a result of performing the first through fifth program loops, the distributions D1, D2, D3, D4, and D5 of the memory cells MC may gradually increase at a uniform interval.

The voltage control signal generator 131 may also be used to determine the first through fifth current pulses Iset1 through Iset5 such that the first through fourth current differences $\Delta IREAD1$, $\Delta IREAD2$, $\Delta IREAD3$, $\Delta IREAD4$ are substantially the same as the current width $\Delta IREAD$ of the final distribution D5 ($\Delta IREAD1 = \Delta IREAD2 = \Delta IREAD3 = \Delta IREAD4 = \Delta IREAD$). Accordingly, as a result of performing the first through fifth program loops, the distributions D1, D2, D3, D4, and D5 of the memory cells MC may gradually increase at a uniform interval. Furthermore, the distributions D1, D2, D3, D4, and D5 of the memory cells MC obtained by performing the first through fifth program loops may be expected, thereby increasing speed and efficiency of a write operation.

Thereafter, the voltage control signal generator 131 may generate the voltage control signal CTRL_vol such that the voltage generator 14 may generate the first control voltage VC corresponding to first current pulses.

Referring to FIG. 13B, the horizontal axis indicates the resistance R and the vertical axis indicates a number of the memory cells. Here, an initial resistance state Ri of the memory cells is assumed to be the fourth resistance state RS4 and a target resistance state Rt is assumed to be the first resistance state RS1.

D1' denotes a first distribution obtained by sequentially applying the first current pulse Iset1 and the verify pulse to the memory cells MC and performing the first program loop. D2' denotes a second distribution obtained by sequentially applying the second current pulse Iset2 and the verify pulse to the memory cells MC and performing the second program loop. D3' denotes a third distribution obtained by sequentially applying the third current pulse Iset3 and the verify pulse to the memory cells MC and performing the third program loop. D4' denotes a fourth distribution obtained by sequentially applying the fourth current pulse Iset4 and the verify pulse to the memory cells MC and performing the fourth program loop. D5' denotes a final distribution obtained by sequentially applying the fifth current pulse Iset5 and the verify pulse to the memory cells MC and performing the fifth program loop.

A difference between a maximum resistance level RU1 of the first distribution D1' and a maximum resistance level RU2 of the second distribution D2' is a first resistance difference $\Delta R1$. A difference between the maximum resistance level RU2 of the second distribution D2' and a maximum resistance level RU3 of the third distribution D3' is a second resistance difference $\Delta R2$. A difference between the maximum resistance level RU3 of the third distribution D3' and a maximum resistance level RU4 of the fourth distribution D4' is a third resistance difference $\Delta R3$. A difference between the maximum resistance level RU4 of the fourth distribution D4' and a maximum resistance level RU5 of the final distribution D5' is a fourth resistance difference $\Delta R4$. A resistance range of the maximum resistance level RU5 and a minimum resistance level RU of the final distribution D5' is $\Delta R$.

The voltage control signal generator 131 may be used to determine the first through fifth current pulses Iset1 through Iset5 such that the first through fourth resistance differences $\Delta R1$, $\Delta R2$, $\Delta R3$, $\Delta R4$ are substantially the same (that is, $\Delta R1=\Delta R2=\Delta R3=\Delta R4$). Accordingly, as a result of performing the first through fifth program loops, the distributions D1', D2', D3', D4', and D5' of the memory cells MC may gradually increase at a uniform interval.

The voltage control signal generator 131 may be used to determine the first through fifth current pulses Iset1 through Iset5 such that the first through fourth resistance differences $\Delta R1$, $\Delta R2$, $\Delta R3$, $\Delta R4$ are substantially the same as the resistance range AR of the final distribution D5' ($\Delta R1=\Delta R2=\Delta R3=\Delta R4=\Delta R$). Accordingly, as a result of performing the first through fifth program loops, the distributions D1, D2, D3, D4, and D5 of the memory cells MC may gradually increase at a uniform interval. Furthermore, the distributions D1', D2', D3', D4', and D5' of the memory cells MC obtained by performing the first through fifth program loops may be expected, thereby increasing speed and efficiency of a write operation.

Thereafter, the voltage control signal generator 131 may generate the voltage control signal CTRL_vol such that the voltage generator 14 may generate the first control voltage VC corresponding to the first current pulses.

Referring back to FIG. 11, the voltage generator 14 may generate the first control voltage VC according to the voltage control signal CTRL_vol. Thus, the write circuit 121A may initiate a set write operation on the memory cells by generating a first current pulse corresponding to the first control voltage VC, and providing the first current pulse to the memory cell MC.

Next, operation of each element of the memory device 10A after applying a first write pulse, for example, the first current pulse, to the memory cells will be described in some additional detail.

After performing the write operation on the memory cells, the read circuit 122A may perform a verify read operation of reading status of the memory cells. In more detail, the read circuit 122A may determine whether the resistance of the memory cells is included in the target resistance state Rt with respect to data that is to be written. In this regard, the target resistance state Rt may correspond to a range between the first reference resistance (for example, RL of FIG. 9) and the second reference resistance (for example, RU of FIG. 9) that is higher than the first reference resistance. For example, the target resistance state Rt is the first resistance state RS1 of FIG. 9, the first reference resistance is RL of FIG. 9, and the second reference resistance is RU of FIG. 9.

In an embodiment, the read circuit 122A may perform a first direction verify read operation of determining whether the resistance of the memory cells is lower than the second reference resistance RU. In this regard, when the resistance of the memory cells is lower than the second reference resistance RU, the read circuit 122A may output the pass signal P indicating that a program has been completed, and, when the resistance of the memory cells is higher than the second reference resistance RU, the read circuit 122A may output the fail signal F indicating that the program has not been completed.

In this regard, when the read circuit 122A generates the pass signal P, the control logic unit 13A may inactivate the operation control signal CTRL_op, and the voltage control signal generator 131 may inactivate the voltage control signal CTRL_vol, based on the pass signal P. In another embodiment, when the read circuit 122A generates the pass signal P, the control logic unit 13A may activate the operation control signal CTRL_op, and the voltage control signal generator 131 may activate the voltage control signal CTRL_vol such that the read circuit 122A may perform a second direction verify read operation.

When the read circuit 122A generates the pass signal P, the write circuit 121A may stop performing the write operation on the memory cells based on the pass signal P irrespective of the input data DATA and may not provide a write pulse to the memory cells.

In the meantime, when the read circuit 122A generates the fail signal F, the control logic unit 13A may activate the operation control signal CTRL_op, and the voltage control signal generator 131 may activate the voltage control signal CTRL_vol based on the fail signal F. In more detail, the voltage control signal generator 131 may control the voltage control signal CTRL_vol such that the voltage generator 14 may generate a second control voltage corresponding to a second current pulse so as to apply the second current pulse to the memory cells.

In another embodiment, the read circuit 122A may perform a second direction verify read operation of determining whether the resistance of the memory cells is higher than the first reference resistance RL. In this regard, when the resistance of the memory cells is higher than the first reference resistance RL, the read circuit 122A may output the pass signal P indicating that the program has been completed, and, when the current resistance of the memory cells is lower than the first reference resistance RL, the read circuit 122A may output the fail signal F indicating that the program has not been completed.

In this regard, when the read circuit 122A generates the pass signal P, the control logic unit 13A may inactivate the operation control signal CTRL_op, and the voltage control signal generator 131 may inactivate the voltage control signal CTRL_vol, based on the pass signal P. In another embodiment, when the read circuit 122A generates the pass signal P, the control logic unit 13A may activate the operation control signal CTRL_op, and the voltage control signal generator 131 may activate the voltage control signal CTRL_vol such that the read circuit 122A may perform the first direction verify read operation.

When the read circuit 122A generates the pass signal P, the write circuit 121A may stop performing the write operation on the memory cells based on the pass signal P irrespective of the input data DATA and may not provide the write pulse to the memory cells.

In the meantime, when the read circuit 122A generates the fail signal F, the control logic unit 13A may activate the operation control signal CTRL_op, and the voltage control signal generator 131 may activate the voltage control signal CTRL_vol, based on the fail signal F. In more detail, the control logic unit 13A may control the voltage control signal CTRL_vol such that the voltage generator 14 may generate the second control voltage corresponding to a third current pulse so as to apply the second current pulse to the memory cells.

Thereafter, the second current pulse may be applied to the memory cells that are not completely programmed as a result of performing the verify read operation. In this regard, the number of the memory cells to which the second current pulse is applied may be smaller than that of the memory cells to which the first current pulse is applied. Thereafter, the verify read operation may be performed on the memory cells to which the second current pulse is applied, and the third current pulse may be applied to the memory cells that are not completely programmed as the result of performing the verify read operation. In this regard, the number of the memory cells to which the third current pulse is applied may be smaller than that of the memory cells to which the second current pulse is applied.

Figure 14:
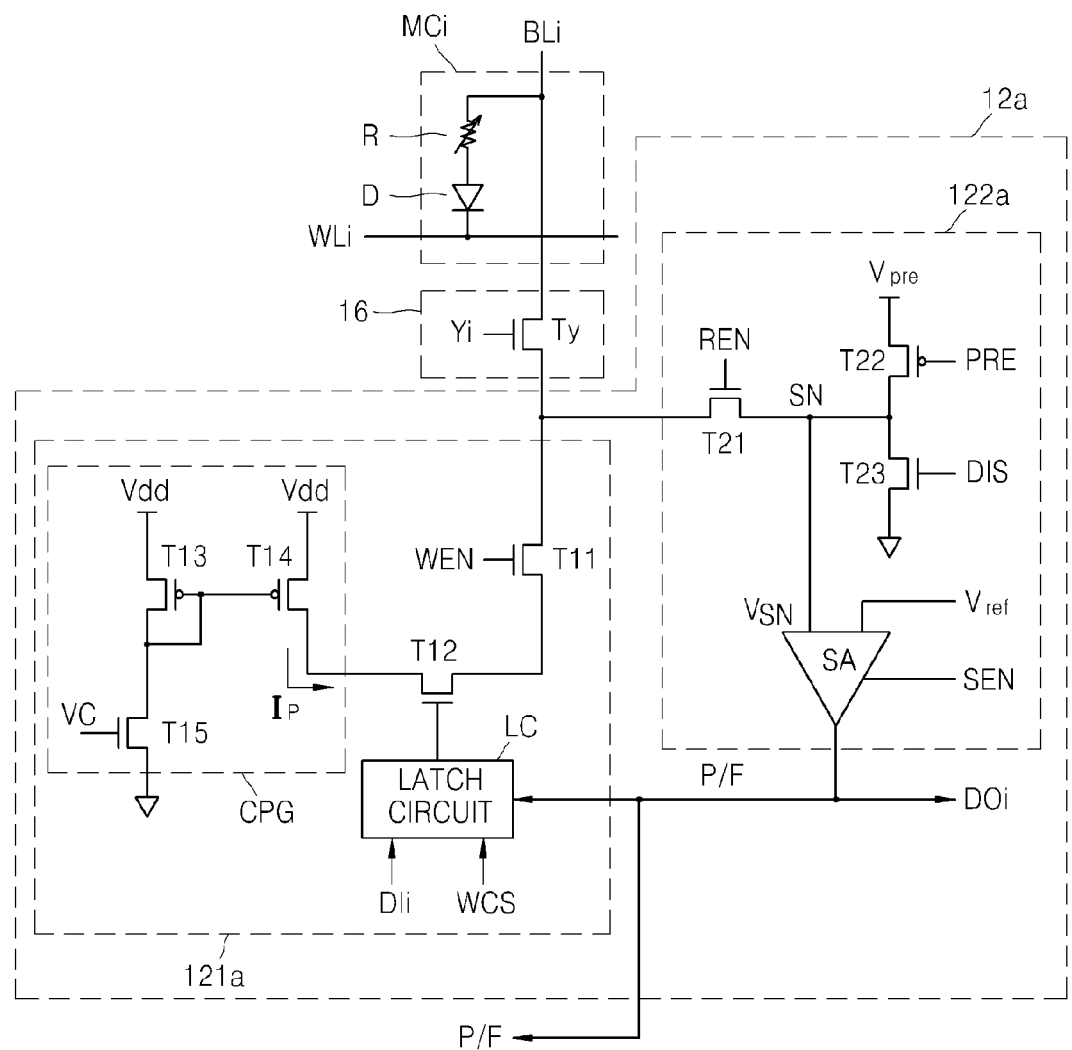
FIG. 14 is a circuit diagram further illustrating in one example the read/write circuit of FIG. 11.

FIG. 14 is a circuit diagram of an example of a first write circuit 121a and an example of a read circuit 122a of FIG. 11.

Referring to FIG. 14, a memory cell MCi is disposed in an area in which a bit line BLi and a word line WLi intersect and includes a variable resistance device R and selection device D. The column decoder 16 may include a bit line selection transistor Ty. The bit line selection transistor Ty may connect the memory cell MCi and the write/read circuit 12a in response to a column address signal Yi. Hereinafter, a case where the column address signal Yi is activated and the memory cell MCi and the write/read circuit 12a are connected to each other will now be described.

The first write circuit 121a may include first and second transistors T11 and T12, a current pulse provider CPG, and a latch circuit LC. If the write enable signal WEN is activated, the first transistor T11 is turned ON, and thus the first write circuit 121a may be connected to the memory cell MCi.

The current pulse provider CPG may include third through fifth transistors T13, T14, and T15. The third and fourth transistors T13 and T14 may constitute a current mirror. The fifth transistor T15 may provide a current pulse Ip in response to the control voltage VC applied to a gate of the fifth transistor T15. The first write circuit 121a may provide the current pulse Ip to the memory cell MCi.

The current pulse Ip may be a write current pulse, and the memory cell MCi may perform a write operation in a set direction according to a write current pulse, or the current pulse Ip may be a verify write current pulse, and the memory cell MCi may perform a verify write operation in the set direction according to the verify write current pulse.

Here, the voltage control signal generator 131 may be used to generate a voltage control signal CTRL_vol, such that a sequence of non-linearly increasing control voltages are generated for each successively executed program loops. Accordingly, the current pulse generator CPG may provide the current pulse Ip that non-linearly increases with each next iteration of a program loop.

The latch circuit LC may output a gate voltage such that the second transistor T12 may be selectively turned ON according to a logic level of an input bit DIi in response to the write control signal WCS. When the write control signal WCS instructs the write operation in the set direction, the latch circuit LC may turn on the second transistor T12 if a logic level of the input bit DIi is "0", and may turn OFF the second transistor T12 if the logic level of the input bit DIi is "1", and when the write control signal WCS instructs the write operation in a reset direction, the latch circuit LC may turn OFF the second transistor T12 if the logic level of the input bit DIi is "0", and may turn on the second transistor T12 if the logic level of the input bit DIi is "1".

The read circuit 122a may include the first through third transistors T21, T22, and T23 and a sense amplifier SA. If the read enable signal REN is activated, the first transistor T21 is turned ON, and thus the read circuit 122a may be connected to the memory cell MCi.

If a precharge signal PRE is activated, the second transistor T12 may be turned ON, and the bit line BLi may be precharged with a precharge voltage Vpre. If a discharge signal DIS is activated, the third transistor T13 may be turned ON, and the bit line BLi may be initialized with a ground voltage.

The sense amplifier SA may be activated according to a sense enable signal SEN, may compare voltage VSN of a sensing node SN with a reference voltage Vref, and may provide an output bit BOi indicating that the memory cell MCi is in an ON state or an OFF state. In a general read operation, the output bit DOi may be provided to the outside of the memory device 10A, for example, the memory controller 20.

Meanwhile, during a verify read operation determining whether a write operation has been successfully completed, the output bit DOi may be provided to the inside of the memory device 10A, for example, the latch circuit LC and the control logic unit 13a, as the pass/fail signal P/F indicating whether the write operation succeeds/fails. The latch circuit LC may turn OFF the second transistor T12 irrespective of the input bit DIi to stop performing the write operation on the memory cell MCi when the pass/fail signal P/F indicates that the write operation has been completed.

Although not shown, in certain embodiments of the inventive concept, the write circuit 121a may further include a voltage pulse generator. The voltage pulse generator may receive the inhibit voltage Vinh or the reset write voltage Vreset provided by the voltage generator 14, generate a voltage pulse corresponding to a received voltage, and provide the voltage pulse to the memory cells.

Figure 15:
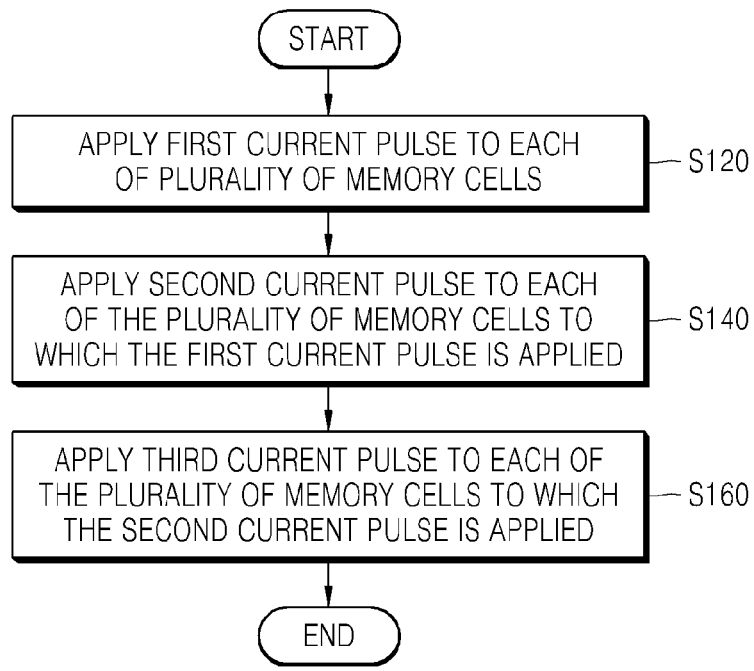
FIGS. 15, 16 and 17 are respective flowchart summarizing methods of operating a memory device according to various embodiments of the inventive concept.

FIG. 15 is a flowchart summarizing a method of operating a memory device according to an embodiment of the inventive concept.

Referring to FIG. 15, the method of operating the memory device according to the present embodiment is a method of performing an operation of writing data to a plurality of memory cells included in a memory cell array included in the memory device. Thus, the descriptions provided above with reference to FIGS. 1 through 14 may apply to the method of operating the memory device according to the present embodiment. The method of operating the memory device according to the present embodiment will now be described with reference to FIGS. 1 through 15 below.

In operation S120, a first current pulse is applied to a plurality of memory cells. In the present embodiment, when the first current pulse is applied to the plurality of memory cells, a set write operation of reducing resistance of the plurality of memory cells may be performed.

In an embodiment, after operation S120, a verify pulse may be applied to the memory cells to which the first current pulse is applied, and thus a verify read operation may be performed on the plurality of memory cells. As a result of performing the verify read operation, no additional current pulse may be applied to the memory cells on which a set write operation is determined to have been completely performed, and the write operation may end. Meanwhile, operation S140 may be performed on the memory cells on which the set write operation is not determined to have been completely performed.

However, the inventive concept is not limited thereto. For example, in another embodiment, after operation S120, the verify read operation may not be performed on the plurality of memory cells but operation S140 may be performed.

In operation S140, a second current pulse is applied to the plurality of memory cells to which the first current pulse is applied. In this regard, the second current pulse may increase by a first difference compared to the first current pulse. The amplitude of the second current pulse may increase by the first difference compared to amplitude of the first current pulse, and/or the width of the second current pulse may increase by the first difference compared to width of the first current pulse.

In operation S140, the second current pulses may be applied to some of the memory cells of which programming is not completed as a result of performing the verify read operation among the plurality of memory cells to which the first current pulses are applied. Thus, the number of the memory cells to which the second current pulses are applied may be smaller than that of the memory cells to which the first current pulses are applied.

After operation S140, a verify pulse may be applied to the plurality of memory cells to which the second current pulse is applied, and thus the verify read operation may be performed on the plurality of memory cells. As a result of performing the verify read operation, no additional current pulse may be applied to the memory cells on which the set write operation is determined to have been completely performed, and the write operation may end. Operation S160 may be performed on the memory cells on which the set write operation is not determined to have been completely performed. However, the inventive concept is not limited thereto, and in another embodiment, after operation S140, the verify read operation may not be performed on the plurality of memory cells but operation S160 may be performed.

In operation S160, a third current pulse is applied to the plurality of memory cells to which the second current pulse is applied. In this regard, the third current pulse may increase by a second difference compared to the second current pulse, and the second difference may be greater than the first difference. In an embodiment, the amplitude of the third current pulse may increase by the second difference compared to amplitude of the second current pulse, and/or the width of the third current pulse may increase by the second difference compared to width of the second current pulse.

In operation S160, the third current pulses may be applied to some of the memory cells of which programming is not completed as a result of performing the verify read operation among the plurality of memory cells to which the second current pulses are applied. Thus, the number of the memory cells to which the third current pulses may be applied may be smaller than that of the memory cells to which the second current pulses are applied.

Figure 16:
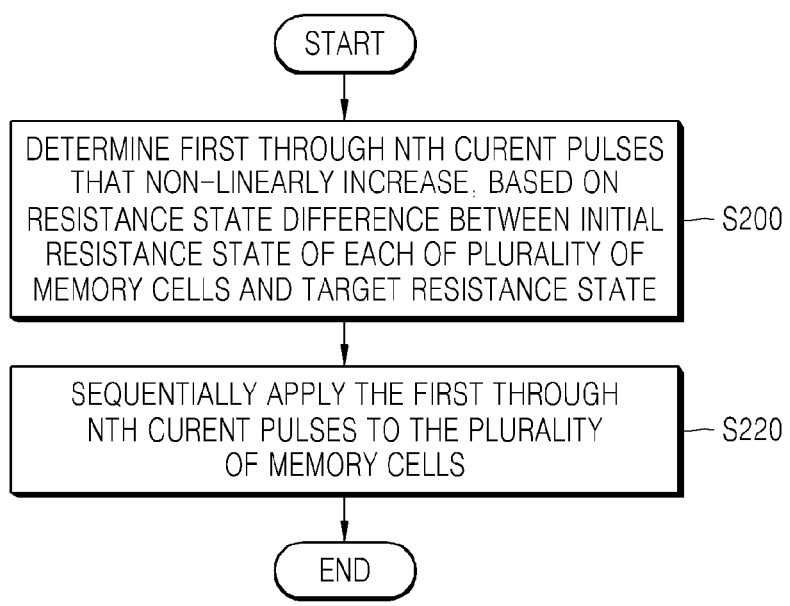

FIG. 16 is a flowchart summarizing a method of operating a memory device according to another embodiment of the inventive concept.

Referring to FIG. 16, the method of operating the memory device according to the present embodiment is a method of performing an operation of writing data to a plurality of memory cells included in a memory cell array included in the memory device. Thus, the descriptions provided above with reference to FIGS. 1 through 14 may apply to the method of operating the memory device according to the present embodiment. The method of operating the memory device according to the present embodiment will now be described with reference to FIGS. 1 through 14 and 16 below.

In operation S200, non-linearly increasing first through Nth current pulses are determined based on a resistance state difference between an initial resistance state Ri of the plurality of memory cells and a target resistance state Rt. Thus, the voltage control signal generator 131 may determine the first through Nth current pulses such that the greater the resistance state difference between the initial resistance state Ri and the target resistance state Rt, the greater the increase range between the first through Nth current pulses.

Thereafter, the voltage control signal generator 131 may generate the voltage control signal CTRL_vol such that first through Nth control voltages corresponding to the determined first through Nth current pulses may be generated and may provide the generated voltage signal CTRL_vol to the voltage generator 14.

In operation S220, the first through Nth current pulses are sequentially applied to the plurality of memory cells. In this regard, the first through Nth current pulses are non-linearly increasing in the direction of the Nth current pulse. In more detail, the voltage generator 14 may sequentially generate first through fourth control voltages based on the voltage control signal CTRL_vol. Thereafter, the write circuit 121 may sequentially generate the first through Nth current pulses in response to the first through fourth control voltages and may sequentially provide the generated first through Nth current pulses to the memory cells.

Figure 17:
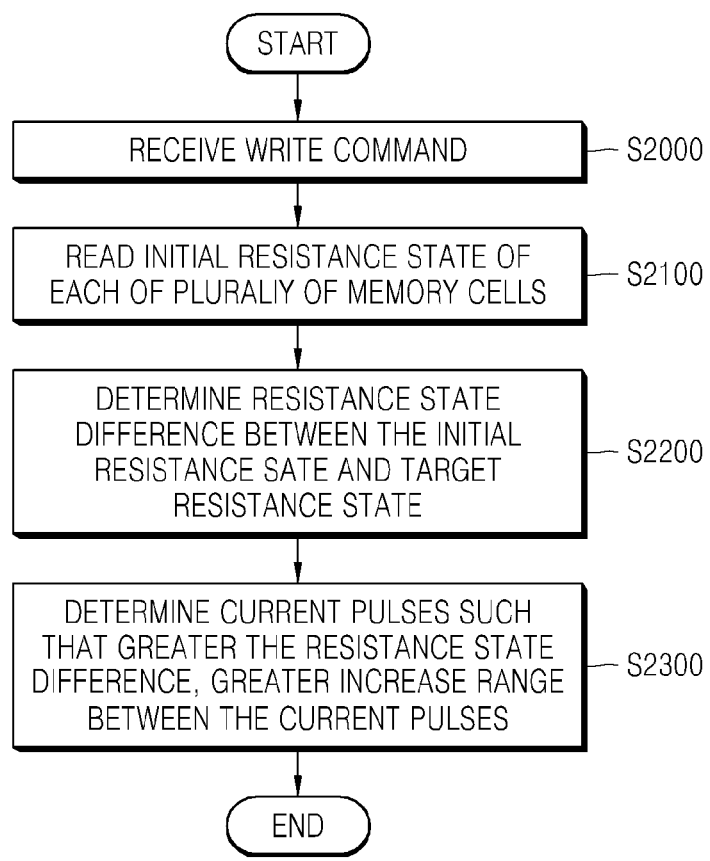

FIG. 17 is a flowchart summarizing a method of operating a memory device according to another embodiment of the inventive concept.

Referring to FIG. 17, the method of operating the memory device according to the present embodiment is a modification example and includes operations S2000 through S2300, instead of operation S200 of FIG. 16. Thus, redundant descriptions between FIGS. 16 and 17 are omitted.

In operation S2000, a write command is received. In more detail, the control logic unit 13 may receive the write command from the memory controller 20.

In operation S2100, an initial resistance state Ri of a plurality of memory cells is read. In more detail, the read circuit 122 may read the initial resistance state Ri of the plurality of memory cells before applying a write pulse.

In operation S2200, a resistance state difference between the initial resistance state Ri and a target resistance state Rt is determined. Thus, the voltage control signal generator 131 may determine the resistance state difference between the initial resistance state Ri and the target resistance state Rt.

For example, in a first case where the initial resistance state Ri of the plurality of memory cells is the fourth resistance state RS4, and the target resistance state Rt is the second resistance state RS2, the resistance state difference between the initial resistance state Ri and the target resistance state Rt is a first resistance state difference. In a second case where the initial resistance state Ri of the plurality of memory cells is the fourth resistance state RS4, and the target resistance state Rt is the first resistance state RS1, the resistance state difference between the initial resistance state Ri and the target resistance state Rt is a second resistance state difference. In this case, the second resistance state difference is greater than the first resistance state difference.

In operation S2300, current pulses are determined such that the greater the resistance state difference, the greater the increase range between the current pulses. In more detail, the voltage control signal generator 131 may determine first through Nth current pulses such that an increase range between the first through Nth current pulses in the second case where the second resistance state difference is greater than the first resistance state difference may be greater than the increase range between the first through Nth current pulses in the first case.

Thereafter, the voltage control signal generator 131 may generate the voltage control signal CTRL_vol such that first through Nth control voltages corresponding to the first through Nth current pulses may be generated and may provide the generated voltage signal CTRL_vol to the voltage generator 14.

Figure 18A:
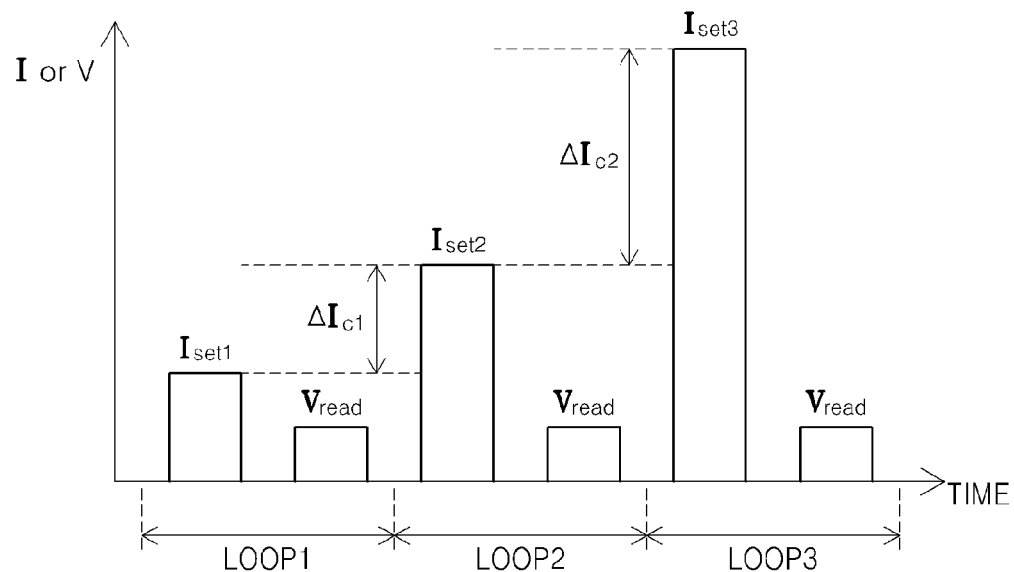
FIGS. 18A, 18B and 18C are respective graphs illustrating examples of current pulses that may be determined during step S2300 of the method of FIG. 17.
Figure 18B:
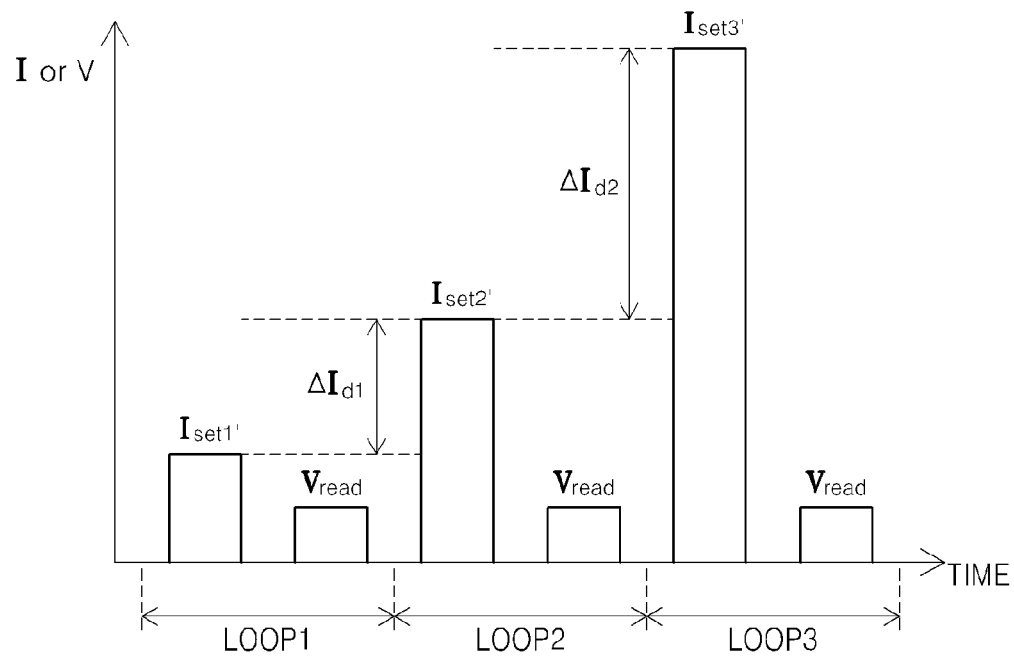
Figure 18C:
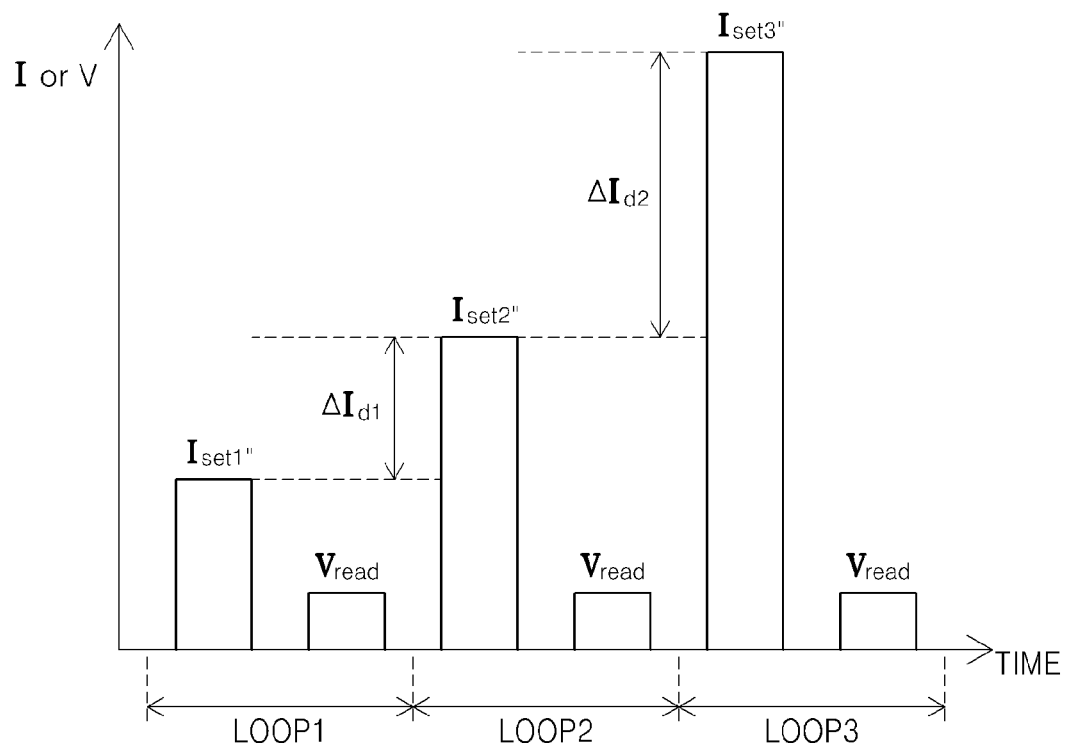

FIGS. 18A, 18B and 18C are graphs illustrating examples of current pulses that may be determined during step S2300 of the method described in relation to FIG. 17.

FIG. 18A shows an example of first through third current pulses Iset1, Iset2, and Iset3 in a first case where an initial resistance state of a plurality of memory cells is the fourth resistance state RS4, and a target resistance state is the second resistance state RS2.

The first current pulse Iset1 and the verify pulse Vread may be sequentially applied to the memory cells in a first program loop LOOP1. The second current pulse Iset2 and the verify pulse Vread may be sequentially applied to the plurality of memory cells MC in a second program loop LOOP2. The third current pulse Iset3 and the verify pulse Vread may be sequentially applied to the memory cells in a third program loop LOOP3.

Here, the amplitude of the second current pulse Iset2 may be greater by a first difference ΔIc1 than that of the first current pulse Iset1, and amplitude of the third current pulse Iset3 may be greater by a second difference ΔIc2 than that of the second current pulse Iset2. In this regard, the second difference ΔIc2 may be greater than the first difference ΔIc1.

FIG. 18B shows an example of first through third current pulses Iset1', Iset2', and Iset3' in a second case where an initial resistance state of a plurality of memory cells is the fourth resistance state RS4, and a target resistance state is the first resistance state RS1.

The first current pulse Iset1' and the verify pulse Vread may be sequentially applied to the plurality of memory cells MC in the first program loop LOOP1. The second current pulse Iset2' and the verify pulse Vread may be sequentially applied to the memory cells in the second program loop LOOP2. The third current pulse Iset3' and the verify pulse Vread may be sequentially applied to the memory cells in the third program loop LOOP3.

Here, the amplitude of the second current pulse Iset2' may be greater by a first difference ΔId1 than that of the first current pulse Iset1', and amplitude of the third current pulse Iset3' may be greater by a second difference ΔId2 than that of the second current pulse Iset2'. In this regard, the second difference ΔId2 may be greater than the first difference ΔId1.

Thus, the first difference ΔId1 of FIG. 18B may be greater than the first difference ΔIc1 of FIG. 18A, and the second difference ΔId2 of FIG. 18B may be greater than the second difference ΔIc2 of FIG. 18A, and an increment between the ΔId1 of FIG. 18B and the second difference ΔId2 of FIG. 18B may be greater than that between the first difference ΔIc1 of FIG. 18A and the second difference ΔIc2 of FIG. 18A.

Referring to FIG. 18C, a horizontal axis represents time, and a vertical axis represent an electrical pulse. FIG. 18C shows an example of first through third current pulses Iset1", Iset2", and Iset3" of the first through third current pulses determined in operation S2300 in the second case where an initial resistance state of a plurality of memory cells is the fourth resistance state RS4, and a target resistance state is the first resistance state RS1.

The first current pulse Iset1" and the verify pulse Vread may be sequentially applied to the memory cells in the first program loop LOOP1. The second current pulse Iset2" and the verify pulse Vread may be sequentially applied to the memory cells in the second program loop LOOP2. The third current pulse Iset3" and the verify pulse Vread may be sequentially applied to the memory cells in the third program loop LOOP3.

The amplitude of the first current pulse Iset1" may be greater than that of the first current pulse Iset1 of FIG. 18A. As described above, it may be determined that the greater the difference between the initial resistance state Ri of the memory cells and the target resistance state Rt, the greater the amplitude of the first current pulse. According to another embodiment, it may be determined that the greater the difference between the initial resistance state Ri of the memory cells and the target resistance state Rt, the greater the width of the first current pulse.

Thus, the amplitude of the second current pulse Iset2" may be greater by the first difference ΔId1 than that of the first current pulse Iset1", and amplitude of the third current pulse Iset3" may be greater by the second difference ΔId2 than that of the second current pulse Iset2". In this regard, the second difference ΔId2 may be greater than the first difference ΔId1.

Figure 19:
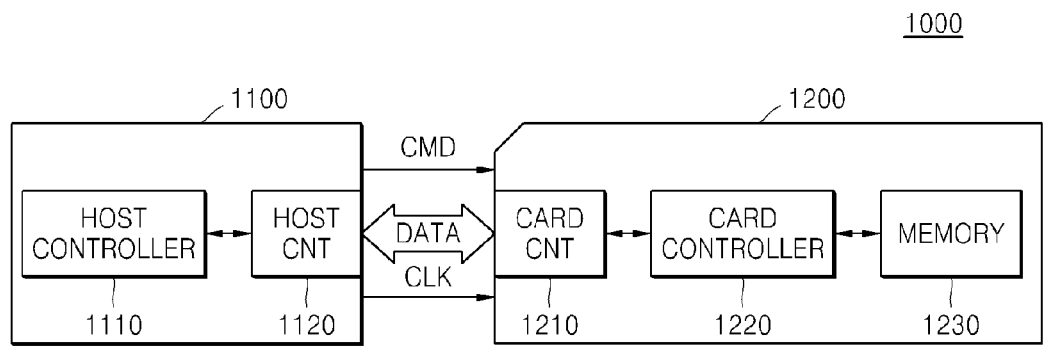
FIG. 19 is a block diagram illustrating a memory card system that may incorporate a memory system according to an embodiments of the inventive concept.

FIG. 19 is a block diagram illustrating in one example a memory card system 1000 that may be configured to incorporate a memory system according to an embodiment of the inventive concept.

Referring to FIG. 19, the memory card system 1000 generally comprises a host 1100 and a memory card 1200, where the host 1100 includes a host controller 1110 and a host connector 1120. The memory card 1200 may include a card connector 1210, a card controller 1220 and a memory device 1230. The memory card 1200 may be realized using the embodiments illustrated in FIGS. 1 through 18C.

The host 1100 may write data to the memory card 1200 or may read data from the memory card 1200. The host controller 1110 may transmit a command signal CMD, a clock signal CLK generated from a clock generator (not shown) in the host 110, and data DATA to the memory card 1200 through the host connector 1120.

The card controller 1220 may receive the command signal CMD through the card connector 1210 to store the data DATA in the memory device 1230 in synchronization with a clock signal generated from a clock generator (not shown) in the card controller 1220. That is, the memory device 1230 may store the data DATA outputted from the host 1100 therein.

The memory card 1200 may be a compact flash card (CFC), a Microdrive, a smart media card (SMC), a multimedia card (MMC), a security digital card (SDC), a memory stick (MC) or a universal serial bus (USB).

Figure 20:
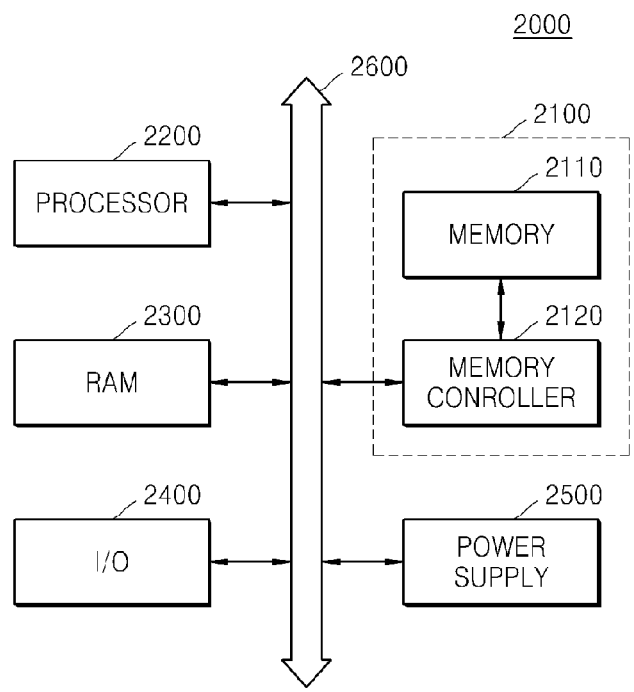
FIG. 20 is a block diagram of a computing system including a memory system according to an embodiment of the inventive concept.

FIG. 20 is a block diagram illustrating a computing system 2000 that may be configured to incorporate a memory system according to an embodiment of the inventive concept.

Referring to FIG. 20, the computing system 2000 may include the memory system 2100, a processor 2200, a random access memory (RAM) 2300, an input/output (I/O) device 2400, and a power supply device 2500. Although not shown in FIG. 20, the computing system 2000 may further include ports which are capable of communicating with a video card, a sound card, a memory card, a USB device or other electronic systems. The computing system 2000 may be a personal computer or a portable electronic system such as a notebook computer, a mobile phone, a personal digital assistant (PDA) or a digital camera.

The processor 2200 may execute specific calculations or specific tasks. In some embodiments, the processor 2200 may be a micro-processor or a central processing unit (CPU). The processor 2200 may communicate with the RAM 2300, the I/O device 2400 and the memory system 2100 through a bus 2600 such as an address bus, a control bus or a data bus. The memory system 2100 may be realized using the embodiments illustrated in FIGS. 1 through 19.

In some embodiments, the processor 2200 may be connected to an expansion bus such as a peripheral component interconnect (PCI) bus.

The RAM 2300 may store data necessary for operations of the computing system 2000 therein. For example, the RAM 2300 may be realized using a DRAM device, a mobile DRAM device, an SRAM device, a PRAM device, an FRAM device, an RRAM device and/or an MRAM device.

The I/O device 2400 may include an input device such as a keyboard, a keypad or a mouse and an output device such as a printer or a display. The power supply device 2500 may supply a power supply voltage necessary for operations of the computing system 2000.

Figure 21:
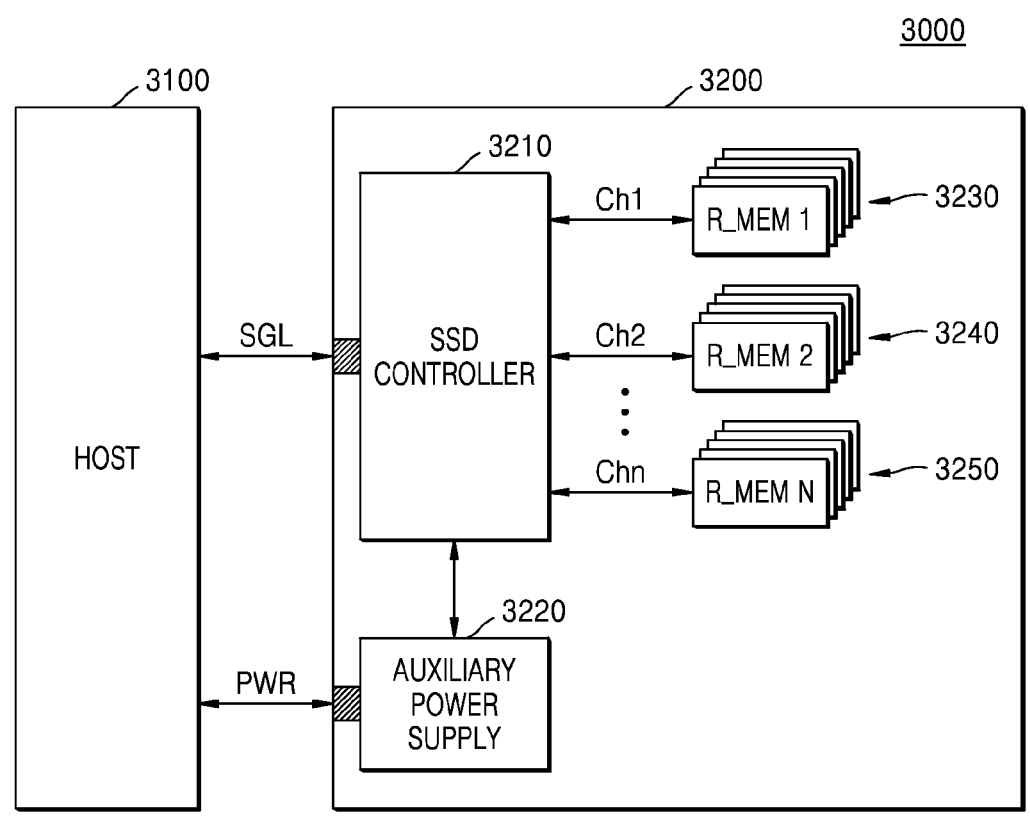
FIG. 21 is a block diagram of a solid state drive (SSD) system including a memory system according to an embodiment of the inventive concept.

FIG. 21 is a block diagram illustrating a solid state drive (SSD) system 3000 including a memory system according to some embodiments of the inventive concept.

Referring to FIG. 21, the SSD system 3000 may include a host 3100 and an SSD 3200. The SSD 3200 may transmit or receive signals SGL to or from the host 3100 through a signal connector and may receive a power supply voltage signal PWR outputted from the host 3100 through a power connector. The SSD system 3200 may include an SSD controller 3210, an auxiliary power supply device 3220 and a plurality of memory devices 3230, 3240 and 3250. The SSD 3200 may be realized using the embodiments illustrated in FIGS. 1 through 20.

While the inventive concept has been particularly shown and described with reference to exemplary embodiments thereof, it will be understood that various changes in form and details may be made therein without departing from the scope of the following claims.

What is claimed is:

1. A method of programming memory cells of a resistive memory device, the method comprising:
   performing a program operation by:
   applying a first current pulse having a first amplitude to the memory cells; and then,
   applying a second current pulse having a second amplitude to the memory cells, wherein the second amplitude is greater than the first amplitude by a first current pulse difference; and then,
   applying a third current pulse having a third amplitude to the memory cells, wherein the third amplitude is greater than the second amplitude by a second current pulse difference,
   wherein the second current pulse difference is greater than the first current pulse difference.

2. The method of claim 1, wherein the program operation is a set program operation, such that the applying of the first current pulse, the second current pulse and the third current pulse to memory cells causes the respective resistances exhibited by the memory cells to decrease.

3. The method of claim 2, wherein the memory cells are capable of being programmed to one of a first distribution, a second distribution, and a third distribution in response to the applying of the first current pulse, the second current pulse and the third current pulse to the memory cells, and
   the method further comprises:
   before applying the first current pulse, determining respective first, second and third amplitudes, such that a first current difference between a minimum current level of the first distribution and a minimum current level of the second distribution is substantially the same as a second current difference between the minimum current level of the second distribution and a minimum current level of the third distribution.

4. The method of claim 2, wherein the memory cells are capable of being programmed to one of a first distribution, a second distribution, and a third distribution in response to the applying of the first current pulse, the second current pulse and the third current pulse to the memory cells, and
   the method further comprises:
   before applying the first current pulse, determining the first, second and third amplitudes, such that a first resistance difference between a maximum resistance level of the first distribution and a maximum resistance level of the second distribution is substantially the same as a second resistance difference between the maximum resistance level of the second distribution and a maximum resistance level of the third distribution.

5. The method of claim 1, wherein the first current pulse has a first pulse width, the second current pulse has a second pulse width, and the third current pulse has a third pulse width,
   wherein the first difference comprises at least one of a difference between the first amplitude and the second amplitude and a difference between the first pulse width and the second pulse width, and the second difference comprises at least one of a difference between the second amplitude and the third amplitude and a difference between the second pulse width and the third pulse width.

6. The method of claim 1, further comprising at least one of:
   performing a verify read operation on the memory cells after applying the first current pulse to the memory cells, and performing the verify read operation on the memory cells after applying the second current pulse to the memory cells, wherein one of the second current pulse or the third current pulse is applied at one of the memory cells that is not completely programmed in response to the performing of the verify read operation.

7. The method of claim 1, wherein each of the plurality of memory cells has one of a plurality of resistance states,
wherein the greater a resistance state difference between an initial resistance state of each of the plurality of memory cells and a target resistance state with respect to data that is to be programmed, the greater the first and second differences.

8. The method of claim 1, wherein each one of the memory cells is a resistive memory cell capable of being programmed in accordance with a plurality of resistance states, wherein the greater a resistance state difference between an initial resistance state for the memory cells and a target resistance state with respect to write data being programmed to the memory cells, the greater a non-linear increment between the first and second differences.

9. A method of operating a resistive memory device including a plurality of memory cells each having one of a plurality of resistance states, the method comprising:
determining first through Nth current pulses that non-linearly increase based on a resistance state difference between an initial resistance state of each of the plurality of memory cells and a target resistance state with respect to data that is to be programmed; and
sequentially applying the first through Nth current pulses to the plurality of memory cells,
wherein an increase range between the first through Nth current pulses increases according to an increase in an N value, and N is a natural number greater than 2.

10. The method of claim 9, wherein the first through Nth current pulses are determined in order that the greater the resistance state difference between the initial resistance state and the target resistance state, the greater an increase range between the first through Nth current pulses.

11. The method of claim 10, wherein the increase range between the first through Nth current pulses is an increase amount of at least one of amplitude and width of each of the first through Nth current pulses.

12. The method of claim 9, wherein the determining of the first through Nth current pulses comprises: determining the second current pulse having a value that increases by a first difference compared to the first pulse, and determining the third current pulse having a value that increases by a second difference compared to the second current pulse, wherein the second difference is greater than the first difference.

13. The method of claim 9, wherein the greater the resistance state difference, the greater N.

14. A method of programming memory cells of a resistive memory device, the method comprising:
performing a program operation by:
applying a first current pulse having a first width to the memory cells; and then,
applying a second current pulse having a second width to the memory cells, wherein the second width is greater than the first width by a first current pulse difference; and then,
applying a third current pulse having a third width to the memory cells, wherein the third width is greater than the second amplitude by a second current pulse difference,
wherein the second current pulse difference is greater than the first current pulse difference.

15. The method of claim 14, wherein the program operation is a set program operation, such that the applying of the first current pulse, second current pulse and the third current pulse to memory cells causes the respective resistances exhibited by the memory cells to decrease.

16. The method of claim 14, wherein the program operation is a reset program operation, such that the applying of the first current pulse, second current pulse and the third current pulse to memory cells causes the respective resistances exhibited by the memory cells to increase.

17. The method of claim 15, wherein the memory cells are capable of being programmed to one of a first distribution, a second distribution, and a third distribution in response to the applying of the first current pulse, the second current pulse and the third current pulse to the memory cells, and
the method further comprises:
before applying the first current pulse, determining respective first, second and third amplitudes, such that a first current difference between a minimum current level of the first distribution and a minimum current level of the second distribution is substantially the same as a second current difference between the minimum current level of the second distribution and a minimum current level of the third distribution.

18. The method of claim 14, further comprising at least one of:
performing a verify read operation on the memory cells after applying the first current pulse to the memory cells, and performing the verify read operation on the memory cells after applying the second current pulse to the memory cells,
wherein one of the second current pulse or the third current pulse is applied at one of the memory cells that is not completely programmed in response to the performing of the verify read operation.

19. The method of claim 14, wherein each of the plurality of memory cells has one of a plurality of resistance states, and
the greater a resistance state difference between an initial resistance state of each of the plurality of memory cells and a target resistance state with respect to data that is to be programmed, the greater the first and second differences.

20. The method of claim 14, wherein each one of the memory cells is a resistive memory cell capable of being programmed in accordance with a plurality of resistance states, wherein the greater a resistance state difference between an initial resistance state for the memory cells and a target resistance state with respect to write data being programmed to the memory cells, the greater a non-linear increment between the first and second differences.

* * * * *